US010804074B2

(12) United States Patent
Zotta et al.

(10) Patent No.: US 10,804,074 B2
(45) Date of Patent: *Oct. 13, 2020

(54) IMAGE PROCESSING SYSTEM AND METHOD OF PROCESSING IMAGES

(71) Applicant: Nanojehm Inc., Albany, NY (US)

(72) Inventors: Matthew Daniel Zotta, Utica, NY (US); Eric Lifshin, Voorheesville, NY (US)

(73) Assignee: Nanojehm Inc., Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/214,945

(22) Filed: Dec. 10, 2018

(65) Prior Publication Data

US 2019/0122854 A1    Apr. 25, 2019

Related U.S. Application Data

(62) Division of application No. 15/603,998, filed on May 24, 2017, now Pat. No. 10,181,391.

(60) Provisional application No. 62/342,047, filed on May 26, 2016, provisional application No. 62/342,051, filed on May 26, 2016.

(51) Int. Cl.
*H01J 37/28* (2006.01)
*G06K 9/52* (2006.01)
(Continued)

(52) U.S. Cl.
CPC ............ *H01J 37/28* (2013.01); *G06K 9/0014* (2013.01); *G06K 9/00134* (2013.01); *G06K 9/52* (2013.01);
(Continued)

(58) Field of Classification Search
CPC ...... H01J 37/28; H01J 37/02; G06K 9/00134; G06K 9/0014; G06K 9/52; G06K 9/6215; G06T 5/001; G06T 2207/10061
(Continued)

(56) References Cited

U.S. PATENT DOCUMENTS 8,186,880 B1    9/2012  Arnold
10,181,391 B2 *  1/2019  Zotta .................... G06T 5/003
(Continued)

OTHER PUBLICATIONS

Guizar-Sicairos, Manuel et al.; "Efficient subpixel image registration algorithms"; Optics Letters; vol. 33; No. 2; Jan. 15, 2008; pp. 156-158.
(Continued)

*Primary Examiner* — Nicole M Ippolito
(74) *Attorney, Agent, or Firm* — Hoffman Warnick LLC

(57) ABSTRACT

The disclosure relates to systems and method for processing images. The method includes selecting a predetermined reference structure, the predetermined reference structure having a known feature size/shape. The method also includes obtaining a reference image of the predetermined reference structure, and capturing a calibration image of the predetermined reference structure using an observation device. The calibration image includes a plurality of features. Additionally, the method includes identifying at least one portion of the plurality of features of the calibration image that include a feature size/shape substantially similar to the known feature size and shape of the predetermined reference structure. Finally, the method includes combining the identified portion of the plurality of features of the calibration image to form a stacked feature image, and determining a point spread function (PSF) of the observation device by comparing the obtained reference image with the stacked feature image.

15 Claims, 19 Drawing Sheets

(51) Int. Cl.
    *H01J 37/02*     (2006.01)
    *G06T 5/00*     (2006.01)
    *G06K 9/00*     (2006.01)
    *G06K 9/62*     (2006.01)

(52) U.S. Cl.
    CPC ............ *G06K 9/6215* (2013.01); *G06T 5/001* (2013.01); *G06T 5/003* (2013.01); *H01J 37/02* (2013.01); *G06T 2207/10061* (2013.01); *H01J 2237/221* (2013.01); *H01J 2237/28* (2013.01); *H01J 2237/2826* (2013.01)

(58) Field of Classification Search
    USPC .......................... 250/306, 307, 309, 310, 311
    See application file for complete search history.

(56) References Cited

U.S. PATENT DOCUMENTS

| | | |
|---|---|---|
| 2004/0213449 A1 | 10/2004 | Safaee-Rad et al. |
| 2016/0180190 A1 | 6/2016 | Lifshin et al. |
| 2017/0309448 A1 | 10/2017 | Boughorbel et al. |
| 2017/0351952 A1 | 12/2017 | Zhang et al. |

OTHER PUBLICATIONS

Notice of Allowance and Fee(s) Due dated Sep. 10, 2018 for U.S. Appl. No. 15/603,998, filed May 24, 2017; pp. 12.

\* cited by examiner

IMAGE PROCESSING SYSTEM AND METHOD OF PROCESSING IMAGES

CROSS-REFERENCE

This application is a divisional application of and claims the benefit of priority of prior U.S. patent application Ser. No., 15/603,998 filed on May 24, 2017, which is based upon and claims the benefit of priority of prior U.S. Provisional Patent Application No., 62/342,047 filed on May 26, 2016, and U.S. Provisional Patent Application No. 62/342,051 filed on May 26, 2016, the entirety of which are both incorporated herein by reference.

TECHNICAL FIELD

The disclosure relates generally to image processing, and more particularly to an image processing system, and a method for processing images obtained using an observation device.

BACKGROUND

Focused charged particle beams are used in many fields including scanning electron and ion microscopy and lithography. The size, shape, and distribution of such charged particle beams, referred to as the point spread function (PSF), is critically important. For example, in the case of a scanning electron microscope (SEM), it is a limiting factor in determining spatial resolution and is also an indicator of instrument performance. Because the beams involved are so small (often from 1 to 20 nanometers at the sample plane) there is no direct detector that can measure the PSF. Without the ability to directly measure the PSF of the charged particle beam, the PSF must be calculated and then may be used to restore images to have higher image resolution, clarity, and/or quality for subsequent examination and analysis. Computational methods for PSF determination are emerging, however, these computational methods are extremely complex, and time consuming. As a result, leave many opportunities for error in the computation.

SUMMARY

Generally, embodiments discussed herein relate to an image processing system and a method of processing images. Images taken by observation devices, such as scanning electron microscopes, may undergo the processes discussed herein to improve image quality, resolution, and clarity. Specifically, a process for determining a point spread function (PSF) for the observation device and a process for restoring images using the determined PSF may improve operations, and functions of the observation device, and the system may in turn also generate, produce, and/or restore images with improved resolution and clarity. Additionally, the system and methods discussed herein may achieve the improved resolution and clarity in its images using less powerful and/or less expensive microscopes. That is, the images generated, produced, and/or restored using the system and methods discussed herein may be of comparable quality and clarity with images taken by microscopes that are much more expensive and have higher power operations, functionality, and imaging capability. With improved resolution and clarity using the system and method discussed herein, a user may obtain high resolution and clear images using equipment that is more affordable, attainable, and operational.

One embodiment may include a method of processing images, the method may include: selecting a predetermined reference structure, the predetermined reference structure having a known feature size and a known feature shape; obtaining a reference feature image of the predetermined reference structure; capturing a calibration image of the predetermined reference structure using a charged particle beam of an observation device, the calibration image including a plurality of features of the predetermined reference structure; identifying at least one portion of the plurality of features of the calibration image that include: a feature size substantially similar to the known feature size of the predetermined reference structure; and a feature shape substantially similar to the known feature shape of the predetermined reference structure; combining the at least one identified portion of the plurality of features of the calibration image to form a stacked feature image; and determining a point spread function (PSF) of the charged particle beam by comparing the obtained reference image of the predetermined reference structure with the stacked feature image.

Another embodiment may include an image processing system. The image processing system may include: an observation device for generating a charged particle beam; and a computer device in communication with the observation device, the computer device for performing a method of processing images including: selecting a predetermined reference structure, the predetermined reference structure having a known feature size and a known feature shape; obtaining a reference image of the predetermined reference structure; obtaining a calibration image of the predetermined reference structure captured by the charged particle beam of the observation device, the calibration image including a plurality of features of the predetermined reference structure; identifying at least one portion of the plurality of features of the calibration image that include: a feature size substantially similar to the known feature size of the predetermined reference structure; and a feature shape substantially similar to the known feature shape of the predetermined reference structure; combining the at least one identified portion of the plurality of features of the calibration image to form a stacked feature image; and determining a point spread function (PSF) of the charged particle beam by comparing the obtained reference image of the predetermined reference structure with the stacked feature image.

A further embodiment may include a computer program product stored on a non-transitory computer readable storage medium for performing a method for processing images. The computer program product may include program code for selecting a predetermined reference structure, the predetermined reference structure having a known feature size and a known feature shape; obtaining a reference image of the predetermined reference structure; obtaining a calibration image of the predetermined reference structure captured by a charged particle beam of an observation device, the calibration image including a plurality of features of the predetermined reference structure; identifying at least one portion of the plurality of features of the calibration image that include: a feature size substantially similar to the known feature size of the predetermined reference structure; and a feature shape substantially similar to the known feature shape of the predetermined reference structure; combining the at least one identified portion of the plurality of features of the calibration image to form a stacked feature image; and determining a point spread function (PSF) of the charged particle beam by comparing the obtained reference image of the predetermined reference structure with the stacked feature image.

BRIEF DESCRIPTION OF THE DRAWINGS

The disclosure will be readily understood by the following detailed description in conjunction with the accompanying drawings, wherein like reference numerals designate like structural elements, and in which.

Figure 1:
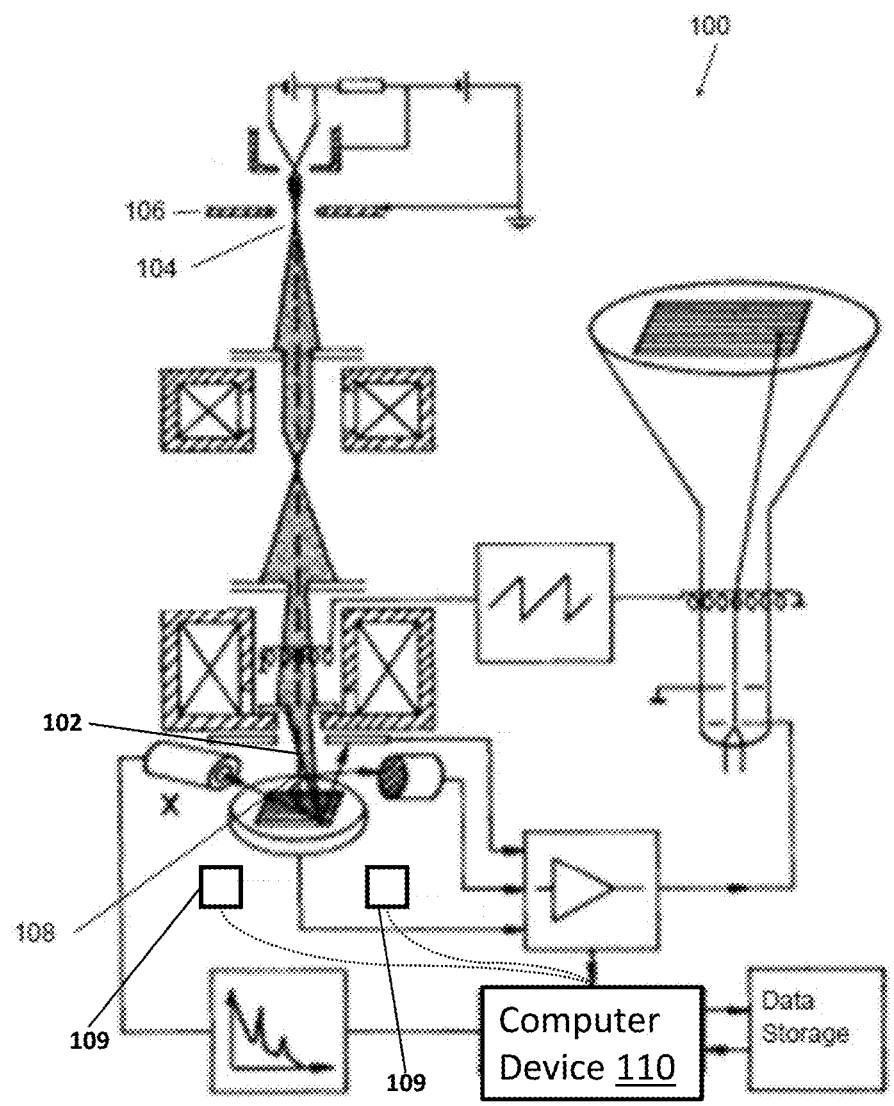
FIG. 1 depicts an image processing system including an observation device and a computer device, according to embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to image processing, and more particularly, to an image processing system, and a methods for processing images obtained using an observation device.

Images taken by observation devices of the image processing system, such as scanning electron microscopes, may undergo the processes discussed herein to improve image quality, resolution, and clarity. Specifically, a process for determining a point spread function (PSF) for the observation device and a process for restoring images using the determined PSF may improve operations, and functions of the observation device, and the system may in turn also generate, produce, and/or restore images with improved resolution and clarity. Additionally, the system and methods discussed herein may achieve the improved resolution and clarity in its images using less powerful and/or less expensive microscopes. That is, the images generated, produced, and/or restored using the system and methods discussed herein may be of comparable quality and clarity with images taken by microscopes that are much more expensive and have higher power operations, functionality, and imaging capability. With improved resolution and clarity using the system and method discussed herein, a user may obtain high resolution and clear images using equipment that is more affordable, attainable and operational.

These and other embodiments are discussed below with reference to FIGS. 1-8. However, those skilled in the art will readily appreciate that the detailed description given herein with respect to these Figures is for explanatory purposes only and should not be construed as limiting.

System Overview

FIG. 1 depicts an image processing system including an observation device and a computer device. As shown in FIG.

1 the observation device may include any device capable of generating a charged particle beam for observing and/or capturing images of samples. In a non-limiting example, the observation device shown in FIG. 1 is a scanning electron microscope 100 (hereafter, "SEM" or "microscope"). In the case of a microscope, the particle beam (probe) 102 is scanned over the sample surface and the intensity of a generated signal, such as secondary or backscattered electrons, is used to form a magnified image of that sample. The image appears on a synchronously scanned image display, such as a light emitting diode (LED) monitor or cathode ray tube (CRT). The magnification of a scanning microscope is the ratio of the distance scanned on the display to that scanned on the sample, and is given as the equation: Magnification=D/S, where D=distance scanned on display, and S=distance scanned on sample. Contrast in the image is a result of point-to-point variations in the intensity of the displayed signal.

A portion 104 of the particle beam is referred to as the crossover, and is formed near the anode 106. The final probe 108 (probe that scans the sample) is nominally an image of the crossover at the sample plane, with the added alterations due to aberrations and diffraction effects. Efforts to determine the size/shape of the crossover have involved placing detectors in the crossover plane or using a scanning source imaging mode. The crossover is an image of the source. However, it may not be a perfect image in that aberrations, such as astigmatism in the objective lens, as well other effects limit or modify the final probe shape (e.g., point spread function (PSF)), as discussed herein. There are two main types of electron sources in use: thermionic (including tungsten filaments and lanthanum hexaboride emitters) and field emitters including cold field emitters, FEGs and Schottky sources (these are not run cold). In the case of thermionic sources, the crossover image is usually the principle factor in determining the PSF, so if it is not round or Gaussian then the PSF will not be either. In the case of the field emitters, some of the other effects may play more of a roll than the crossover in determining the final probe shape, but a full understanding of just what it should look like theoretically has not yet been developed. If one had a detector that could accurately measure the crossover, which may be hundreds of times larger for a thermionic source than the final probe, then it may be possible to postulate the final shape because it is mainly a function of the image of the crossover. In field emission systems, the source demagnification is very small (~10×)—compared to the thermionic source (~1,000×-10,000×). In practice, it is not possible to measure it directly in the plane of the sample/target with existing state of the art. State of the art electron detectors have ~1 micrometer resolution or ~100× larger than focused electron beams with either source. Therefore, it is practically possible to measure the PSF directly in either case. A knife-edge experiment might be extended down to 10 nanometers under perfect conditions, but that is unlikely because no edge is perfect and transmission and scattering effects make it practically impossible to achieve accurate results. Furthermore, it provides information in only one direction at a time, so multiple scans would be needed over a wide range of angles. Additionally, it would be limited to measuring point spread functions where the central region is at higher intensity than the edges.

SEM 100 may also include sensors and/or detectors 109 (hereafter, "detectors 109") positioned adjacent the final probe 108 and the sample being examined by the SEM 100. These detectors 109 may include, but are not limited to, backscatter electron detectors, x-ray electron detectors, secondary electron detectors, and the like. It is understood that the images discussed below for determining the point spread function (PSF) for an observation device, such as SEM 100, may be generated and/or created using detectors 109 of the SEM 100. That is, detectors 109 of SEM 100 may detect the electrons that are reflected, backscattered, and/or bounce off of or emitted from the sample being observed by the SEM 100.

Also shown in FIG. 1, a computer device 110 is connected to and/or in communication with SEM 100 for receiving data obtained by SEM 100. That is, and as discussed in detail below, computer device 110 may be in communication with SEM 100 and various components of SEM 100 to obtain images captured by SEM 100 during operation. Also as discussed in detail herein, computer device 110 may be configured to receive these captured images, and utilize them to determine a point spread function (PSF) for SEM 100 and restore additional images captured by SEM 100 using the determined PSF. Computer device 110 may also be configured to utilize PSF for SEM 100 to identify changes to the operational performances of SEM 100 and other observation devices connected to computer device 110, as discussed herein. Computer device 110 may be directly connected to and/or in direct communication with the SEM 100, or alternatively, may receive or obtain the images taken by the SEM 100 using suitable, transportable storage components (e.g., portable hard drives, jump drives and so on) that may be in communication with, receive and store the images from the SEM 100.

Point Spread Function Process

Figure 2:
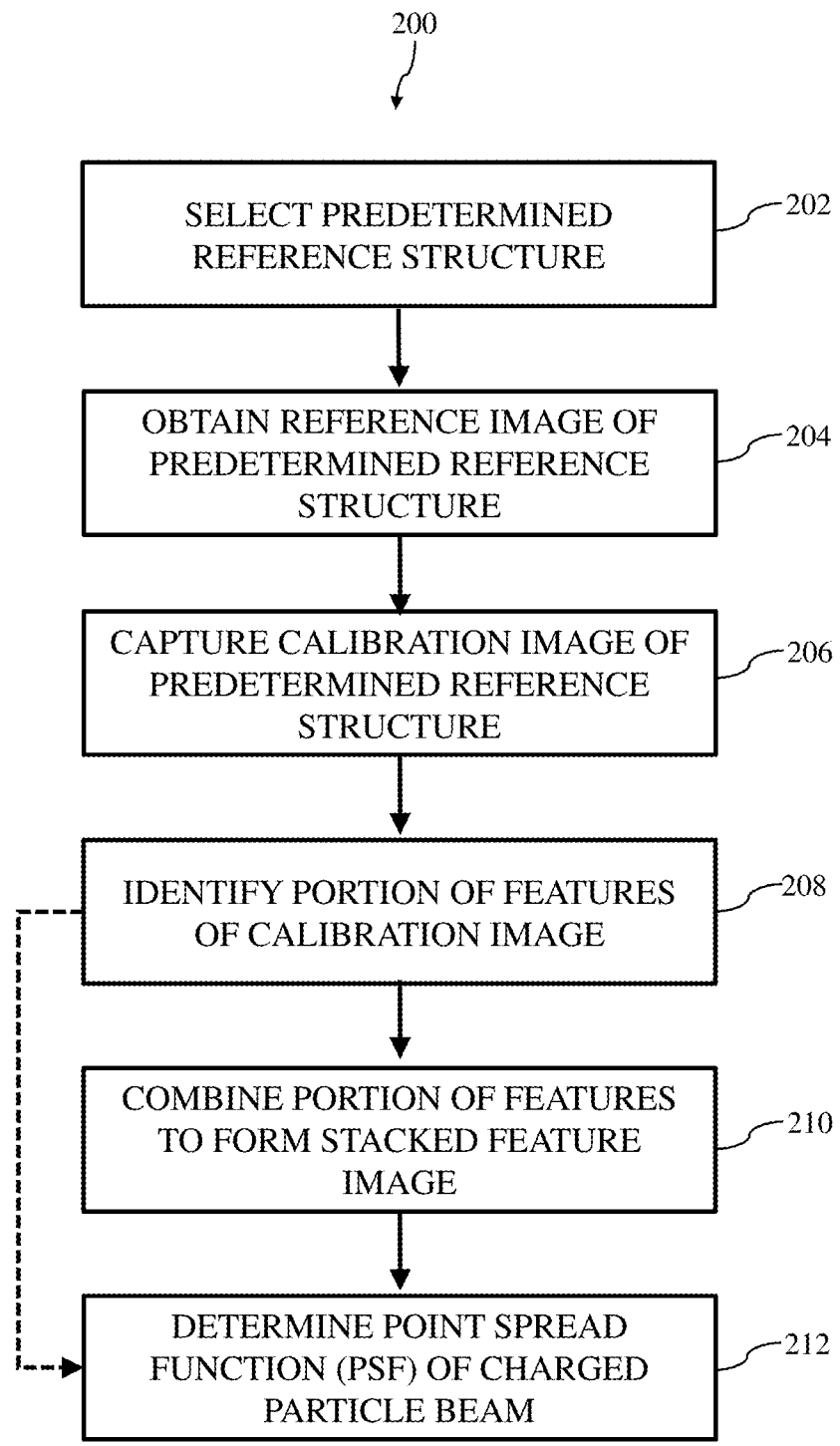
FIG. 2 depicts a method for processing an image, according to embodiments.

FIG. 2 depicts an example process for processing images. Specifically, FIG. 2 is a flowchart depicting one example process 200 for processing images to determine a point spread function (PSF) for a charged particle beam of an observation device (e.g., microscope).

In operation 202, a predetermined reference structure may be selected. The predetermined reference structure may be selected from a group of elements capable of aiding in the determination of a point spread function, as discussed herein. It is understood that the reference structure may be any element, compound, tissue or sample that may be produce a high contrast image when examined by an observation device. Specifically, the reference structure may be formed from any sample structure that when examined by an observation device produces a highly visible contrast between the reference structure and the backing material or component in which the reference structure is positioned on and/or deposited over. As a result, the signal-to-noise ratio for the predetermine reference structure may also be substantially improved or high. In non-limiting examples, the predetermined reference structure may be selected from a clearly defined structure including, but not limited to, gold particles, nano-sized parallel lines deposited on a sheet, a plurality of printed nano-dots, etched markings on a silicon-based sample, deposited copper material, and other structures having similar characteristics (e.g., increased reflectivity, improved signal-to-noise ratio). The selected predetermined reference structure may include a known, well defined, detectable, and/or established structure or feature size for the features, particles or materials forming the reference structure. Additionally, the selected predetermined reference structure may also include a known, well defined, detectable, and/or established particle or structure shape for the features, particles or materials forming the reference structure. In non-limiting examples, the known feature size of the features making up the selected, predetermined reference structure may be within a range of approximately 5 nanometers (nm) to approximately 30 nm. The feature size may be a diameter when the feature is a particle that is substantially circular in shape, or alternatively, may be the longest measurable distance between opposite perimeter points when the feature and/or particle is substantially polygonal in shape, as discussed herein. Additionally, the known shape of the feature of the predetermined reference structure may be a variety of shapes so long as the edges, perimeter, and/or the shape characteristics of the features are clearly defined and/or easily visible when examined using an observation device. In non-limiting examples, the known feature shape for the predetermined reference structure includes any shape having eight (8) sides or less, and more specifically, the known feature shape may be a circle, an oval, a triangle or a quadrilateral. The feature or features of the predetermined reference structure may be dependent, at least in part, on the composition and/or characteristics of the predetermined reference structure. In non-limiting examples, the feature or features of the predetermined reference structure may include, but is not limited to, particle(s) when the predetermined reference structure is a chemical element or compound, individual nano-dots or nano-lines when the predetermined reference is a sample of nano-dots or nano-lines, at least one well-defined etched portion when the predetermined reference is an silicon sample including etched markings and similar features of a sample or structure having the desired characteristics as discussed herein.

In operation 204, a reference image of the predetermined reference structure may be obtained. The obtained reference image may be an image of a reference (e.g., particle) of the predetermined reference structure that includes a known feature size and a known feature shape. The obtained reference image may depict a simulated image of the features of the predetermined reference structure taken, captured, and/or generated under ideal and/or substantially error-free circumstances. Alternatively, the obtained reference image may depict an actual high-resolution image of the reference structure and the features of the reference structure. In a non-limiting example, the obtained reference image may be an image of a particle of a chemical element forming the predetermined reference structure that is free of noise and point spread function that is typically associated with capturing an image using an observation device (e.g., substantially error-free circumstances). In another non-limiting example, the reference image may include a high resolution image of a particle of a chemical element forming the reference structure previously taken with a high-resolution observation device. The obtained reference image may be generated before beginning the process 200 discussed herein, and may be stored and subsequently obtained and/or accessed once the predetermined reference structure is selected in operation 202.

In operation 206, a calibration image of the predetermined reference structure may be captured. Specifically, a calibration image of a sample of the predetermined reference structure is captured using a charged particle beam of an observation device (e.g., microscope). The calibration image of the sample of the predetermined reference structure includes a plurality of visible features (e.g., particles) of the reference structure. The feature size and feature shape of the plurality of features found in the sample of the predetermined reference structure may ideally be similar to the selected predetermined reference structure, and in turn, the feature size and feature shape of the feature(s) depicted in the obtained reference image. However, due to compositional variations, crystallinity, physical alterations, and/or chemical changes within the sample of the predetermined reference structure, and/or operational characteristics of the observation device, some features or portions of the feature in the sample of the predetermined reference structure may vary in size and/or shape. In a non-limiting example, the sample of the predetermined reference structure may be formed on a support component, thin substrate or film (e.g., carbon-coated transmission electron microscope (TEM) grid). Unlike the predetermined support structure, which may substantially reflect electrons generated by the charged particle beam of the observation device, the support component substantially transmits electrons such that they do not contribute significant background signal.

In operation 208, at least one portion of features of the plurality of features depicted in the calibration image may be identified. The portion(s) of features of the plurality of features in the calibration image that may be identified includes a feature size that may be substantially similar to the known feature size of the predetermined reference structure, and a feature shape that may be substantially similar to the known feature shape of the predetermined reference structure. Identifying the portion of features may include analyzing each individual feature of the plurality of features of the calibration image, and determining shape characteristics for each individual particle of the calibration image. Once the shape characteristics are determined, the feature size and the feature shape for each feature (e.g., particle) of the plurality of features depicted in the calibration image may be determined. The determined feature size and determined feature shape for each feature of the plurality of features depicted in the calibration image may then be compared to the known feature size and known feature shape of the predetermined reference structure to determine if the feature size and feature shape for each feature of the plurality of features depicted in the calibration image is substantially similar to the known feature size and known feature shape of the predetermined reference structure. The features depicted in the calibration image that include a feature size and feature shape substantially similar to the known feature size and known feature shape of the predetermined reference structure may form the identified portion of the plurality of features depicted in the calibration image. Distinct features that include a feature size and feature shape distinct from the known feature size and known feature shape of the predetermined reference structure may be discarded from further use and/or analysis.

In operation 210, the at least one identified portion of features of the plurality of features depicted in the calibration image are combined. The portion(s) of features are combined to form a stacked feature image of all the features (e.g., particles) that make up the identified portion(s) of features. More specifically, once the portion of features are identified (e.g., operation 208), the portion(s) of features of the plurality of features depicted in the calibration image may be isolated from distinct features of the plurality of features that are not included in the identified portion(s) of features. As discussed above, these distinct features may include features depicted in the calibration image that include a feature size and feature shape distinct from the known feature size and known feature shape of the predetermined reference structure. In a non-limiting example, these may be features (e.g., particles) that are depicted as grouped and/or clumped together, such that multiple features appear to be a single mass in the calibration image, and therefore difficult to detect the individual feature size or feature shape for each of the grouped features. After isolating the identified portion(s) of features of the plurality of features depicted in the calibration image, each feature of the identified portion(s) of features may be cropped to form a plurality of individual features images for each particle of the identified portion(s) of features. That is, calibration image may be cropped and/or cut into various individual feature images of the particles included in the identified portion(s) of particles. Once cropped, each of the plurality of individual feature images may be aligned and subsequently layered, masked, and/or stacked on top of one another, to form the stacked feature image from the plurality of individual feature images. As a result of aligning, layering, masking, and/or stacking the individual feature images to produce the stacked feature image, the stacked feature image may depict a single feature (e.g., particle) made up of each individual feature image. Additionally by forming the stacked feature image, the stacked feature image provides and/or produces an image of a single feature (e.g., particle) with improved signal quality, signal-to-noise ratio, minimized contamination of the features forming the stacked feature image, and/or evened or leveled inhomogeneity of the features and the feature characteristics (e.g., shape, size) of the feature depicted in the calibration image.

In operation 212, a point spread function (PSF) of the charged particle beam is determined. Specifically, the PSF for the charged particle beam used to capture the calibration image (e.g., operation 206) may be determined by comparing the obtained reference image of the predetermined reference structure (e.g., operation 204) with the stacked feature image (operation 210). In determining the PSF, and specifically comparing the obtained reference image with the stacked feature image, the obtained reference image of the predetermined reference structure may be layered and/or masked over the stacked feature image, and the obtained reference image of the predetermined reference structure may be aligned with the stacked feature image, such that a center of the obtained reference image is aligned with a center of the single feature (e.g., particle) depicted in the stacked feature image. Once aligned, the PSF may be determined by calculating a difference in feature size between the obtained reference image of the predetermined reference structure and the single feature depicted in the stacked feature image, and storing the calculated difference in feature size. Additionally, the PSF may be determined by calculating a difference in feature shape between the obtained reference image of the predetermined reference structure and the single feature depicted in the stacked feature image, and storing the calculated difference in the feature shape.

In another non-limiting example shown in FIG. 2, after identifying portion(s) of features of the plurality of features depicted in the calibration image in operation 208, operation 210 may be skipped, and operation 212 may be performed immediately after or subsequent to operation 208 (see, phantom line). In the non-limiting example where operation 212 is performed immediately after operation 208, the determination of the PSF of the charged particle beam and/or observation device may including additional steps, operations and/or processes. For example, once portion(s) of features of the plurality of features depicted in the calibration image are identified (e.g., operation 208), an image of each individual portion of features (e.g., individual particles) identified may be compared to the obtained reference image of the predetermined reference structure (e.g., operation 204) to determine an individual PSF. That is, an image of each individual, identified portion of features from the calibration image may be compared to the obtained reference image of the predetermined reference structure to determine and/or calculate various, individual PSFs. The various, individual PSFs in this non-limiting example may be determined and/or calculated in a similar manner as discussed herein (e.g., obtained reference image of the predetermined reference structure masked over and aligned with the identified portion(s), calculating a difference in feature size/shape between the obtained reference image and identified portion(s)). Once the various, individual PSFs are determined and/or calculated using the images of each identified portion(s) of features and the obtained reference image, the various, individual PSFs may be combined, calculated and/or manipulated to determine or calculate a final PSF, that may be utilized for additional image processing, as discussed herein.

In an additional non-limiting example, operations of process 200 may include additional steps, operations and/or processes for determining the PSF. For example, in operation 208 it may be determined that substantially all of the features depicted in the calibration image include a feature size substantially distinct to the known feature size of the predetermined reference structure. As such, no portion(s) of the features may be identified for us in determine the PSF as discussed in process 200 above. In this non-limiting example, when the size of the features in the calibration image are distinct from the size of the known features, operation 208 may include identifying at least one portion of features of the plurality of features depicted in the calibration image that include a size within a predetermined distribution or tolerance (e.g., ±3 nanometers) of the size of the known features. Specifically, in order to determine the PSF, portion(s) of features in the calibration image may be identified that are within the predetermined distribution or tolerance of the size of the known features, and may subsequently be combined to form a stacked feature image (e.g., operation 210) that may include a single feature (e.g., particle) made up of each individual, identified feature image of the portion(s) that were within the predetermined, size distribution or tolerance. Additionally, once it is determined that the identified portion includes features not similar to the know feature, but within a predetermined, distribution or tolerance, the obtained reference image of predetermined reference structure may be adjusted and/or modified. That is, the feature in the obtained reference image of predetermined reference structure may be adjusted (e.g., made larger, made smaller) based on, for example, the determined size of the identified features in operation 208, and/or the deviation from the known size of the feature in the obtained reference image. Finally, the stacked feature image including the identified feature image of the portion(s) that were within the predetermined, size distribution or tolerance may then be compared to the modified, reference image of the predetermine reference structure to determine the PSF, as discussed herein with respect to operation 212.

In a further non-limiting example, a combination of the two alternative processes and/or operations discussed above may be perform. More specifically, and as discussed herein, when the size of the features in the calibration image are distinct from the size of the known features, operation 208 may include identifying at least one portion of features of the plurality of features depicted in the calibration image that include a size within a predetermined distribution or tolerance (e.g., ±3 nanometers) of the size of the known features. However, instead of combining the identified portion of features to form a stacked feature image (e.g., operation 210) that may include a single feature (e.g., particle) made up of each individual, identified feature within the predetermined, size distribution or tolerance, the identified portion of features may remain as individual images. Each of these individual images including the identified portion of features within the predetermined, size distribution or tolerance may then be compared to a modified, reference image of the predetermine reference structure to determine and/or calculate various, individual PSFs. As discussed herein, once the various, individual PSFs are determined and/or calculated using the images of each identified portion(s) of features within the predetermined, size distribution or tolerance, and the modified, obtained reference image, the various, individual PSFs may be combined, calculated and/or manipulated to determine or calculate a final PSF. The final PSF may be utilized for additional image processing, as discussed herein.

After determining the PSF for the charged particle beam of the observation device, the determined PSF may be utilized on its own for beam characterization and/or to restore subsequent images taken by the observation device. Specifically, the determined PSF may be utilized to restore and/or improve images taken by the observation device under similar operation conditions and/or characteristics (e.g., beam energy or intensity, beam size, distance between objective lens and sample (e.g., working distance), and so on).

Restoring Images Using Point Spread Function Process

Figure 3:
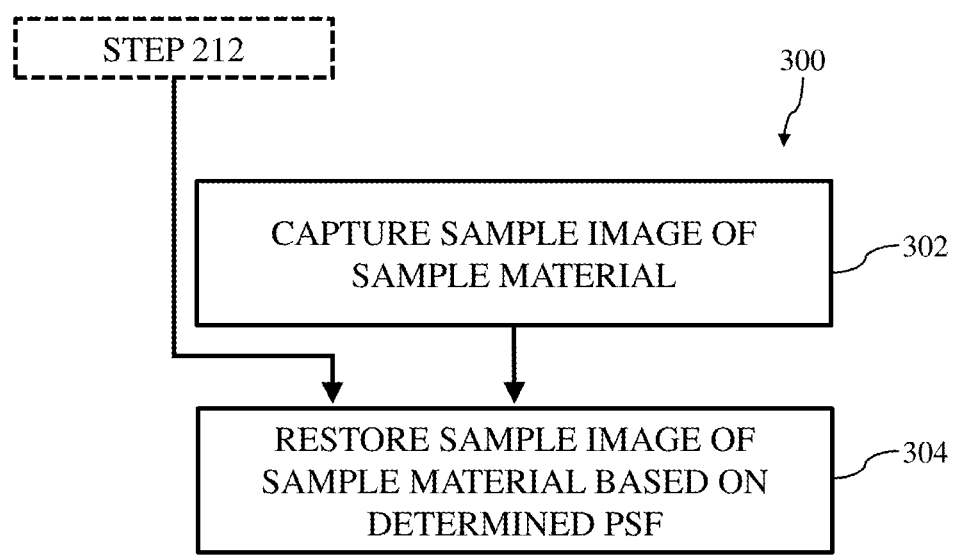
FIG. 3 depicts a method for generating a restored image of a sample material using the method of FIG. 2, according to embodiments.

FIG. 3 depicts an example process for restoring an image. Specifically, FIG. 3 is a flowchart depicting one example process 300 for restoring an images using a determined point spread function (PSF) of a charged particle beam of an observation device (e.g., microscope).

As discussed above, the PSF may be determined using the process 200. Once the PSF is determined (e.g., operation 212 (shown in phantom)), process 300 may begin. In operation 302, a sample image of a sample material may be captured using the charged particle beam of the observation device. The sample material may be distinct from the predetermined reference structure used to determine the PSF. In non-limiting examples, the sample material may be any element, compound, component, tissue, and/or other sample that may be examined using the observation device and may require further analysis of the sample image captured by the observation device. The observation device and charged particle beam may capture the sample image of the sample material using the same operational conditions and/or characteristics as those used to determine the PSF in process 200. That is, the operational characteristics for the observation device and charged particle beam may be substantially similar when capturing the calibration image of the predetermined reference structure in operation 206 (see, FIG. 2) and when capturing the sample image of the sample in operation 302. The operational characteristics may include, but are not limited to, a beam size of the charged particle beam, an intensity of the charged particle beam, a working distance between the objective lens and the sample to be captured (e.g., predetermined reference structure, sample material), an angular position of the charged particle beam with respect to the sample, and any other operational characteristic that may affect the PSF of the observation device.

In operation 304, the captured sample image of the sample material may be restored using the determined PSF (e.g., operation 212). That is, the determined PSF may be utilized to restore the captured sample image. Specifically, the PSF may be recalled, obtained, and/or utilized to deconvolute the sample image. The features, particles, and/or components depicted in the captured sample image may have depicted portions (e.g., edges, body) associated with and/or created by PSF. These depicted portions associated with and/or created by PSF may be restored during the deconvolution process. These PSF associated-portions, for example edges, of the particles and/or components depicted in the captured sample image may be smoothed, sharpened, de-blurred, and/or otherwise improved to more clearly define the shape characteristics (e.g., perimeter) of the features, particles, and/or components in the restored sample image. Additionally, other identified portions, for example the body, of the features, particles, and/or components in the restored sample image associated with and/or created by PSF may also be smoothed, sharpened, de-blurred, and/or otherwise improved to provide more detail and/or clarity in the restored sample image. As a result, the restored sample image of the sample material may include a higher image resolution and/or higher image clarity than the captured sample image of the sample material.

In the instance where an operational condition and/or characteristic of the observation device and/or charged particle beam is adjusted and/or altered from the original operational characteristics used to perform process 200, similar operations discussed herein may be performed to determine a new point spread function (PSF). The new PSF may be based on the adjusted operational characteristics of the observation device and/or charged particle beam. For example, in response to adjusting the operation characteristics of the observation device and/or charged particle beam, operations 206-212 may be performed again under the adjusted operational characteristics to determine the new PSF. Specifically, a distinct calibration image of the predetermined reference structure may be captured (see, operation 206) under the adjusted operational characteristics of observation device and/or charged particle beam. Subsequently, at least a distinct portion of features of the plurality of features depicted in the distinct calibration image may be identified (see, operation 208). Then, the identified, distinct portion of features of the plurality of features depicted in the distinct calibration image may be combined to form a distinct stacked feature image (see, operation 210). Finally, the new or distinct PSF of the charged particle beam operating under the adjusted operational characteristics may be determined by comparing the obtained reference image of the predetermined reference structure with the distinct stacked feature image (see, operation 212).

FIGS. 4A-4H depict the process 200 (see, FIG. 2) of determining a point spread function (PSF) for a charged particle beam of an observation device (e.g., microscope). It is understood that the images depicted in FIGS. 4A-4H and the reference structures and/or elements associated with these images are non-limiting examples of the images and/or output feedback that may be produced when determining the PSF using the process 200. Additionally, and as discussed herein in detail below, the images depicted in FIGS. 4A-4H may be produced, analyzed, manipulated, and/or processed using a computer device and program product stored on the computer device that is configured to perform the operations of process 200 for determining the PSF for a charged particle beam of an observation device.

Figure 4A:
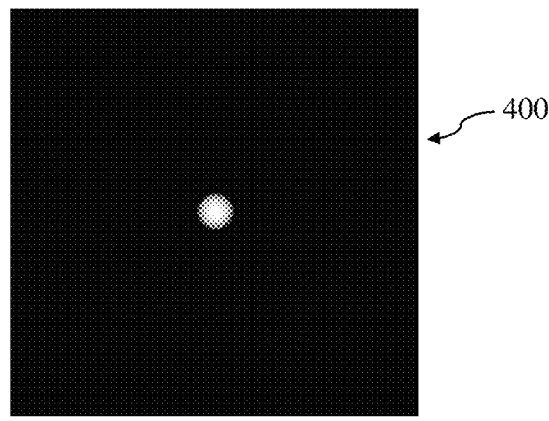
FIG. 4A depicts an obtained reference image for a predetermined reference structure, according to embodiments.

FIG. 4A depicts an obtained reference image 400 of a predetermined reference structure. Specifically, FIG. 4A depicts the obtained reference image 400 of a single feature of a predetermined reference structure to be utilized in processing images and determining a PSF for a charged particle beam of an observation device. The obtained reference image 400 may be dependent on the predetermined reference structure that is selected for use in determining the PSF, as discussed herein. The obtained reference image 400 may be generated and/or created using an image generating program for features of the predetermined reference structure and stored on a computing device, storage device or the like. In a non-limiting example, the depicted feature in the obtained reference image 400 may be generated and/or shown in ideal imaging and/or operational circumstances. That is, the feature of the predetermined reference structure depicted in the obtained reference image 400 may be shown free of and/or without noise and a point spread function (PSF) typically caused by the operational circumstance and conditions of an observation device used to capture the image of an actual feature of the predetermined reference structure. In another non-limiting example, the obtained reference image 400 may be a high-resolution image of a sample of the predetermined reference structure taken using a high-resolution observation device (e.g., microscope). The feature of the predetermined reference structure shown in the obtained reference image 400 may include a known feature shape and known feature size. In the non-limiting example shown in FIG. 4A, the predetermined reference structure may be gold (Au), which includes particles having a substantially circular shape and a diameter of approximately 19 nanometers (nm).

Although gold is discussed as being the predetermined reference structure, it is understood that variety of other elements may be used. That is, and as discussed herein, the reference structure may be any element, compound, tissue or sample that may produce a highly contrasting image when examined by an observation device, and/or may include an improved signal-to-noise ratio. Additionally, the size and/or shape of the non-limiting example shown in FIG. 4A is merely an example, and the particle of the predetermined reference structure may include a variety of shapes, sizes, and/or materials as discussed herein. Furthermore, it is understood that the feature of the predetermined reference structure (and features of other images discussed below) may refer to a particle of gold, where the predetermined reference structure is gold. As such, the terms "feature" and "particle" may be interchangeable with respect to the discussion of FIGS. 4A-5C. The obtained reference image 400 of the predetermined reference structure shown in FIG. 4A may correspond to operations 202 and 204 of process 200 shown in FIG. 2.

Figure 4B:
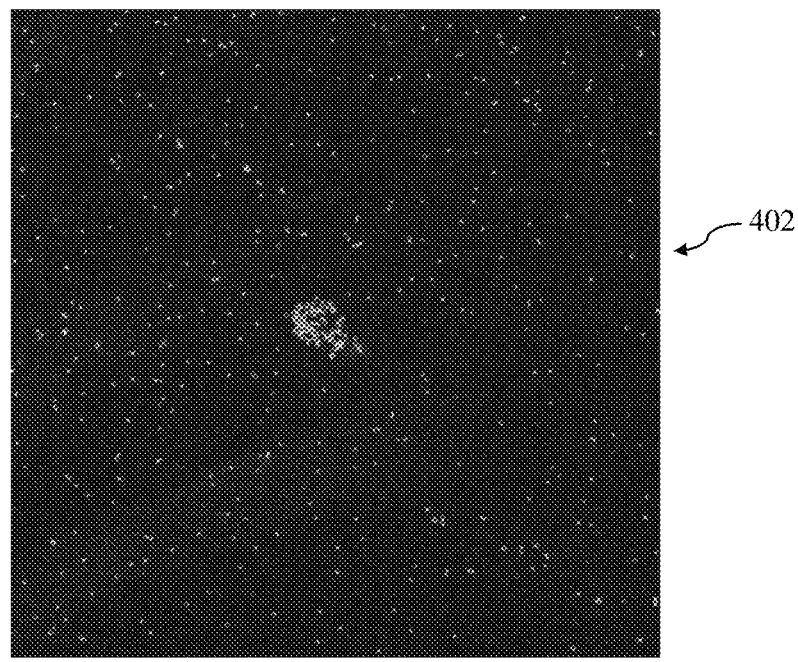
FIG. 4B depicts a captured calibration image of the predetermined reference structure of FIG. 4A taken by an observation device, according to embodiments.

FIG. 4B shows a captured calibration image 402 of the predetermined reference structure. More specifically, the calibration image 402 may be a captured image of an actual sample of the predetermined reference structure including the known feature size and shape. As shown in FIG. 4B, calibration image 402 may include a plurality of visible features or particles of the predetermined reference structure. The sample of the predetermined reference structure used for calibration image 402 may be the same structure or element as the predetermined reference structure selected and associated with the obtained reference image 400 (see, FIG. 4A). Continuing the non-limiting example above, the sample predetermined reference structure used for calibration image 402 may be gold (Au), and may include particles that are substantially circular in shape and include a diameter of approximately 19 nm. Calibration image 402 of the sample of the predetermined reference structure may be captured using a charged particle beam of an observation device, as discussed herein. Additionally as discussed herein, after capturing calibration image 402, calibration image 402 may be provided to, produced, and/or depicted on a computer device in communication with the observation device. The calibration image 402 of the predetermined reference structure shown in FIG. 4B may correspond to operation 206 of process 200 shown in FIG. 2.

Figure 4C:
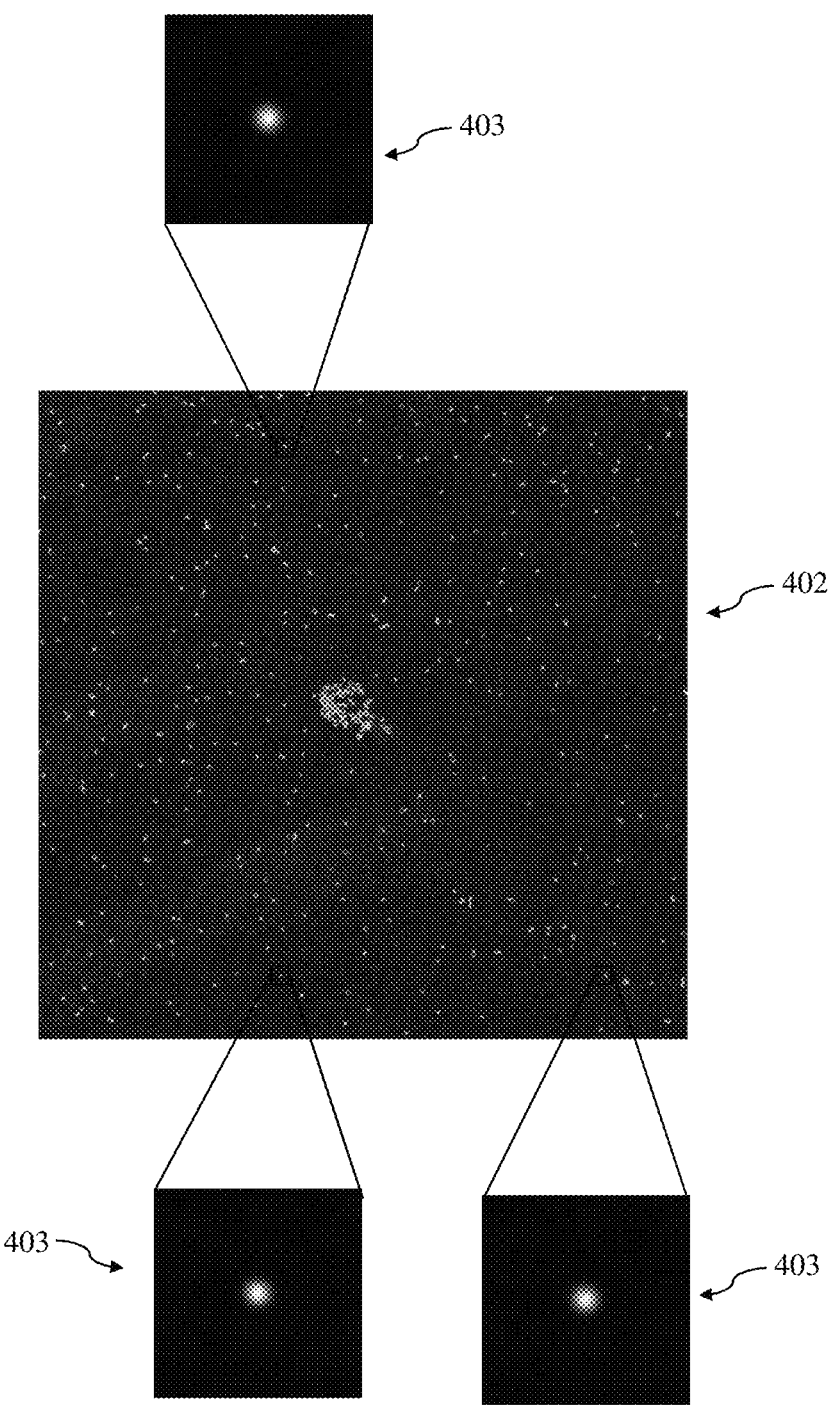
FIG. 4C depicts the captured calibration image of FIG. 4B and various individual feature images for particles included in an identified portion of features depicted in the calibration image, according to embodiments.

FIG. 4C depicts the captured calibration image 402 of FIG. 4B and various individual feature images 403 for features or particles included in an identified portion of features or particles depicted in the calibration image 402. That is, the individual feature images 403 may be images of individual particles or collection of particles that have been identified as a portion of particles of the sample predetermined reference structure that include a feature size and feature shape that may be substantially similar to the known feature size and shape, respectively, of the predetermined reference structure. The particles depicted in the individual feature image 403 may be identified by analyzing each individual particle of the plurality of features of the calibration image 402, and determining shape characteristics for each individual particle of the calibration image 402. Once the shape characteristics are determined, the feature size and the feature shape for each particle of the plurality of features depicted in the calibration image 402 may be determined. The determined feature size and determined feature shape for each particle of the plurality of features depicted in the calibration image may then be compared to the known feature size and known feature shape of the predetermined reference structure to determine if the feature size and feature shape for each particle of the plurality of features depicted in the calibration image 402 is substantially similar to the known feature size and known feature shape of the predetermined reference structure. The particles that include a feature size and feature shape substantially similar to the known feature size and known feature shape of the predetermined reference structure may form the identified portion of the plurality of features depicted in the calibration image 402. Although only three individual feature images 403 are depicted, it is understood that more particles may be identified and included in the portion of the plurality of features of the predetermined reference structure that have the desired feature size and feature shape, as discussed above. The number of identified particles shown in the individual feature images 403 is merely exemplary and is not limiting to the number of particles that may be identified. As discussed herein, a computer device that receives the calibration image may perform the operations to identify the portion of particles that have similar feature sizes and feature shapes as the predetermined reference structure. Identifying the particles depicted in the individual feature images 403 shown in FIG. 4C may correspond to operation 208 of process 200 shown in FIG. 2.

Figure 4D:
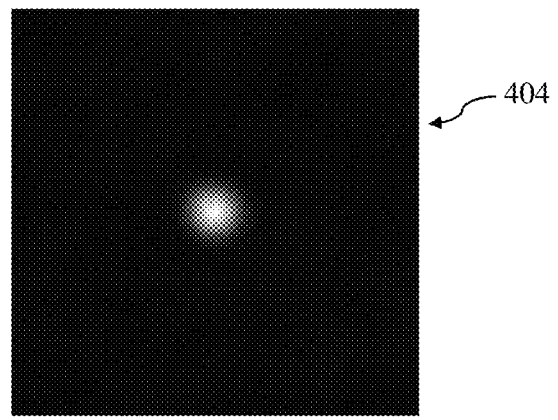
FIG. 4D depicts a stacked feature image formed from particles of the captured calibration image of FIG. 4B, according to embodiments.

FIG. 4D depicts a stacked feature image 404. The stacked feature image 404 may be a combination of the identified portion of features or particles of the predetermined reference structure depicted in the calibration image 402 (see, FIG. 4B) that have substantially similar feature sizes and feature shapes as the particles of the predetermined reference structure. Calibration image 402 may be cropped and/or cut into various individual feature images 403 (see, FIG. 4C) of the particles included in the identified portion(s) of particles of the predetermined reference structure. Once cropped, each of the plurality of individual feature images 403 may be aligned and subsequently layered, masked, and/or stacked on top of one another, to form the stacked feature image 404 from the plurality of individual feature images 403. As a result of aligning, layering, masking, and/or stacking the individual feature images 403 to produce the stacked feature image 404, the stacked feature image 404 may depict a single particle made up of each individual feature image 403 (see, FIG. 4C). The cropping, aligning, layering, masking, stacking, and/or combining of the individual feature images 403 taken from the calibration image 402 to form the stacked feature image 404 may be performed using a computer device and program product stored on the computer device configured to perform these processes. Combining the identified portion(s) of particles depicted in the individual feature images 403 to form the stacked feature images 404 shown in FIG. 4D may correspond to operation 210 of process 200 shown in FIG. 2.

Figure 4E:
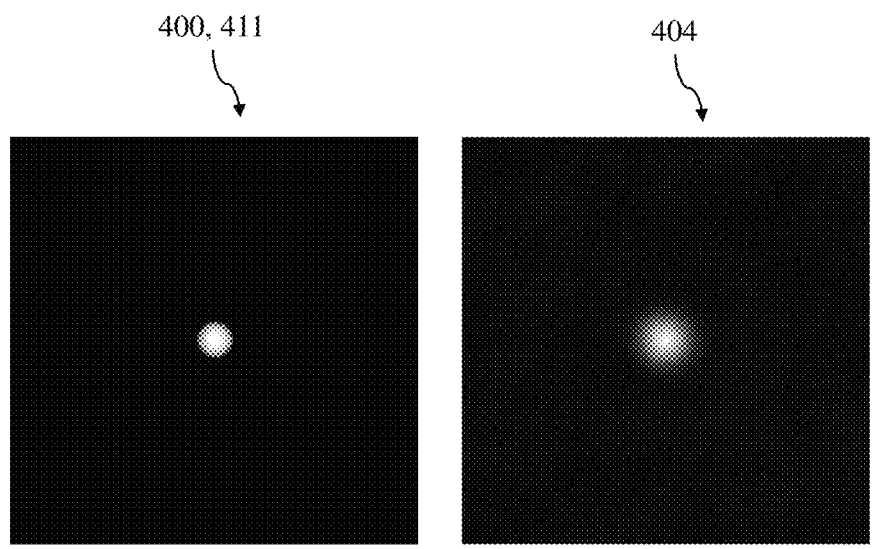
FIG. 4E depicts a side-by-side comparison image of the obtained reference image of FIG. 4A and the stacked feature image of FIG. 4D, according to embodiments.

FIG. 4E depicts a side-by-side comparison of the obtained reference image 400 of the predetermined reference structure, and the stacked feature image 404 of the predetermined reference structure. As shown in FIG. 4E, the single feature or particle depicted in the stacked feature image 404 may have a greater diameter and/or size than the particle depicted in the obtained reference image 400; even though the particles in the calibration image 402 used to generate or form the stacked feature image 404 were substantially similar in size as the particle depicted in the obtained reference image 400. Additionally, the shape of the particle depicted in the stacked feature image 404 may distinct and/or less uniform than the shape of the particle depicted in the obtained reference image 400. Finally, as shown in FIG. 4E, a "halo," blurred edge, and/or edge distortion may be depicted in the stacked feature image 404. The difference in size, shape and image distortion (e.g., halo) may be the effects of the point spread function (PSF) associated with the charged particle beam of the observation device.

Figure 4F:
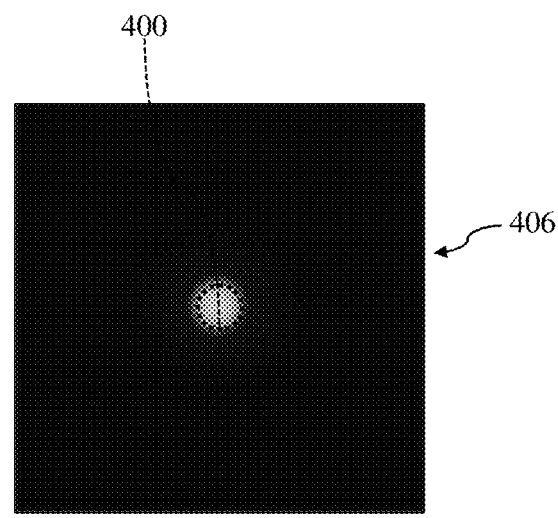
FIG. 4F depicts an overlay image of the obtained reference image of FIG. 4A and the stacked feature image of FIG. 4D, according to embodiments.

FIG. 4F depicts an overlay image 406 of the obtained reference image 400 of FIG. 4A and the stacked feature image 404 of FIG. 4D. Overlay image 406 may be formed by comparing the obtained reference image 400 and the stacked feature image 404. Specifically, overlay image 406 may be generated and/or produced by aligning, layering, masking, stacking, and/or combining the obtained reference image 400 and the stacked feature image 404 to form a single particle depicted in overlay image 406. As shown in the non-limiting example of FIG. 4F, color intensity of the particle depicted in overlay image 406 may vary. Specifically, the color, light, and/or illumination intensity of the particle depicted in overlay image 406 may vary as the distance from the center of the particle increases. In the non-limiting example shown in FIG. 4F, a solid bright color or light may represent the portion of the particle depicted in the reference image 400 (also shown in phantom) that matches and/or corresponds to as similar portion of the particle depicted in the first stacked feature image 404. Moving away from the center of the particle shown in overlay image 406 and the defined edges of the solid color or light, the color or light may fade or dim to a darker color or light, and/or the intensity of the color decreases (e.g., not as visible or bright). This portion of the overlay image 406 may be the "halo" found only around the particle depicted in the stacked feature image 404. As a result, this portion of the overlay image 406 may indicate and/or depict the point spread function (PSF) associated with observation device. The overlay image 406 may be created and/or generated by a computer device and a computer program product stored on the computer device that may be configured to compare, align, layer, mask, and/or stack the obtained reference image 400 and the stacked feature image 404.

In another non-limiting example (not shown), PSF may be determined and/or represented by a distinction of color in overlay image 406. That is, colors of particles or features in overlay image 406 may vary. In the non-limiting example, the color of the particle depicted in overlay image 406 may vary as the distance from the center of the particle increases. For example, a solid bright color (e.g., green) may represent the portion of the particle depicted in the obtained reference image 400 that matches and/or corresponds to as similar portion of the particle depicted in the stacked feature image 404. Moving away from the center of the particle shown in overlay image 406 and the defined edges of the solid bright color, the color fades to a darker color (e.g., red) and the intensity of the color decreases (e.g., not as visible).

Figure 4G:
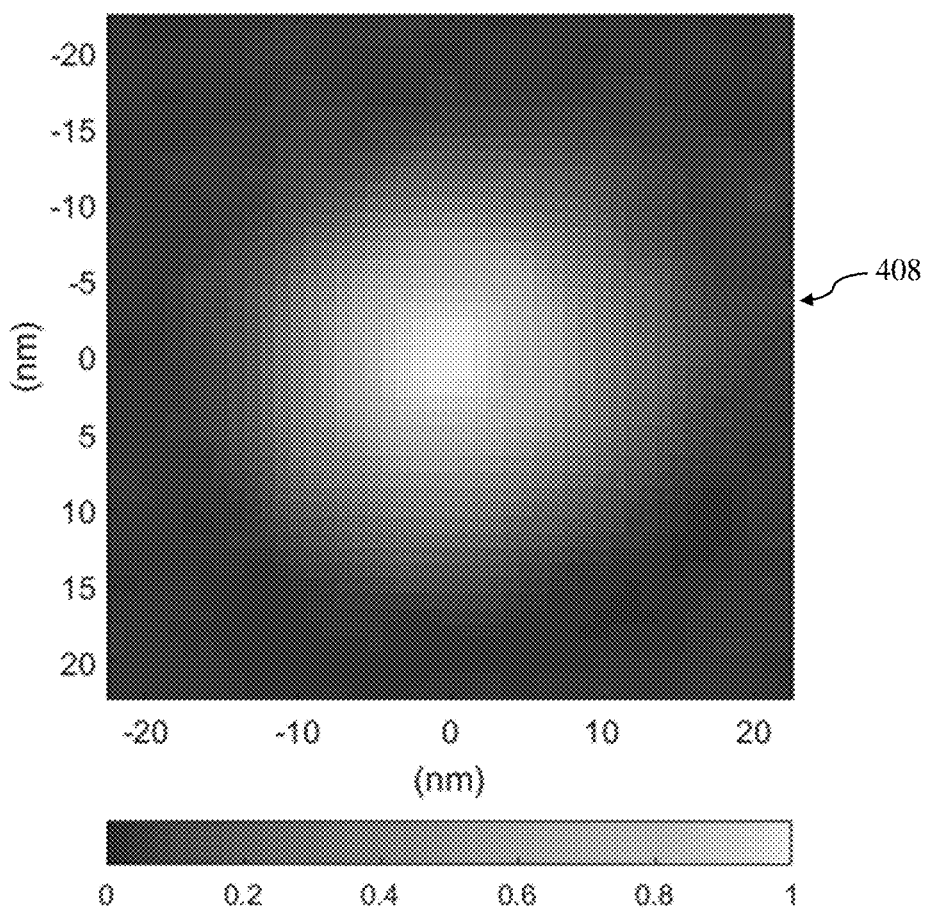
FIG. 4G depicts an image plot of the determined point spread function (PSF) for the observation device, according to embodiments.
Figure 4H:
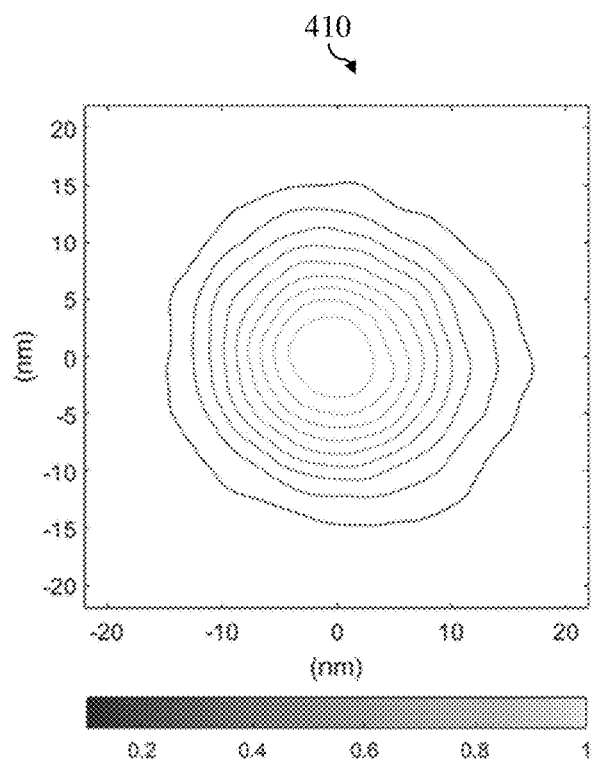
FIG. 4H depicts a contour plot of the determined point spread function (PSF) for the observation device, according to embodiments.
Figure 4I:
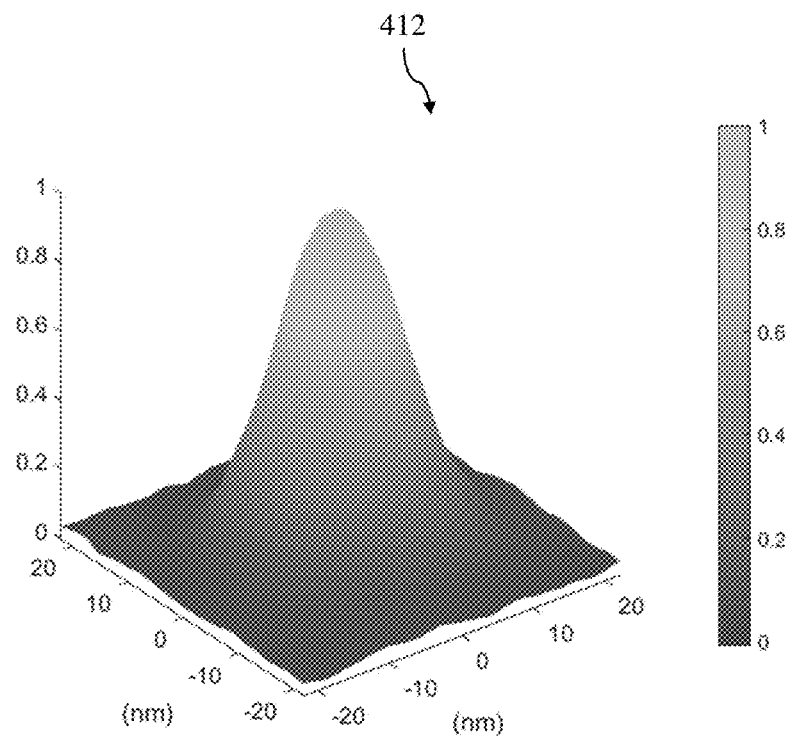
FIG. 4I depicts a three-dimensional surface plot of the determined point spread function (PSF) for the observation device, according to embodiments.

FIGS. 4G-4I depict various generated plot images for the determined and/or calculated point spread function (PSF) for the observation device used to capture calibration image 404 (see, FIG. 4B) of the predetermined reference structure. Specifically, the computer device and computer program product configured to generate the overlay image 406 may compare and/or analyze the overlay image 406 to calculate and/or determine the PSF for the charged particle beam of the observation device used in the process. The PSF may be calculated by running the program product that includes various algorithms for analyzing the various images (e.g., obtained reference image 400, calibration image 402, stacked feature image 404 and overlay image 406). Once the PSF is determined, the various plot images depicted in FIGS. 4G-4I may be produced for a user of the observation device to understand the PSF, how it affects images captured by the observation device, and to provide graphic indicators or representation of the PSF for the observation device. FIG. 4G depicts an image plot 408 of the determined PSF, which depicts the PSF for the observation device by showing color and/or light gradients to identify the actual feature or particle and the PSF (similar to the example discussed herein with respect to FIG. 4F). FIG. 4H depicts a contour plot 410 of the determined PSF, which depicts the detected, calculated, and/or measured shape of the feature or particle and PSF for the observation device by showing boarder colors and/or light gradients to identify the actual feature or particle and the PSF. FIG. 4I depicts a three-dimensional surface plot 412 of the determined PSF, which depicts the PSF for the observation device by showing color and/or light gradients to identify the actual feature or particle and the PSF, as well as, as three-dimensional position or shape distortion or distribution (e.g., mainly in z-axis). All of the plots 408, 410 and 412 depicted in FIGS. 4G-4I may be generated by the computer device including the program product. Determining the PSF by combining the obtained reference image 400 and the stacked feature images 404 to generate the overlay image 406 shown in FIG. 4F, and the associated plot images 408, 410 and 412 of the determined PSF shown in FIGS. 4G-4I, may correspond to operation 212 of process 200 shown in FIG. 2.

With continued reference to FIGS. 2 and 4A-4I, additional non-limiting examples for determining the PSF for the observation device may be discussed. For example, rather than combining the various individual feature images 403 of calibration image 402 (see, FIG. 4C; e.g., operations 210) to form stacked feature image 404 (see, FIG. 4D), each individual feature images 403 (e.g., operation 208) may be compared to obtained reference image 400 of a predetermined reference structure (see, FIG. 4A) to determine PSF (e.g., operation 212) for an observation device (e.g., SEM 100 (see, FIG. 1)). Specifically, and in a similar manner discussed herein with respect to FIGS. 4F-4I, each individual feature images 403 may be compared (separately or individually) to obtained reference image 400 of a predetermined reference structure, to determine and/or calculate various, individual PSFs. Once the various, individual PSFs are determined and/or calculated using individual feature images 403 and obtained reference image 400, the various, individual PSFs may be combined, calculated and/or manipulated to determine or calculate a final PSF; similar to those shown in FIGS. 4F-4I.

In another non-limiting example, it may be determined that none of the features in calibration image 402 (see, FIG. 4C; e.g., operations 208) are identified as having similar size and/or shape as the size and/or shape of the known feature depicted in obtained reference image 400. When the size of the features in calibration image 402 are distinct from the size of the known features in obtained reference image 400, calibration image 402 may be again analyzed to identify at least one portion of features of the plurality of features that include a size within a predetermined distribution or tolerance (e.g., ±3 nanometers) of the size of the known features. For example, and distinct from the example discussed above, individual feature images 403 shown in FIG. 4C may not include a size similar to the feature depicted in obtained reference image 400, but may include a size within a predetermined, feature size distribution or tolerance for the feature depicted in obtained reference image 400. As such, stacked feature image 404 shown in FIG. 4D may include identified portions of calibration image 402 and/or individual feature images 403 of features that are within the predetermined, feature size distribution or tolerance for the feature depicted in obtained reference image 400. In order to determine the PSF, obtained reference image 400 of the predetermined reference structure may be adjusted and/or modified. For example, and as shown in FIG. 4E, a modified reference image 411 of predetermined reference structure may be adjusted (e.g., made larger, made smaller), obtained and/or generated based on, for example, the determined size of the identified features in individual feature images 403 and/or stacked feature image 404, and/or the deviation from the known size of the feature in the obtained reference image 400. As similarly discussed herein with respect to FIGS. 4E-4I, the PSF may be determined using individual feature images 403 and/or stacked feature image 404, including features within the predetermined, size distribution or tolerance, and modified reference image 411.

Figure 5A:
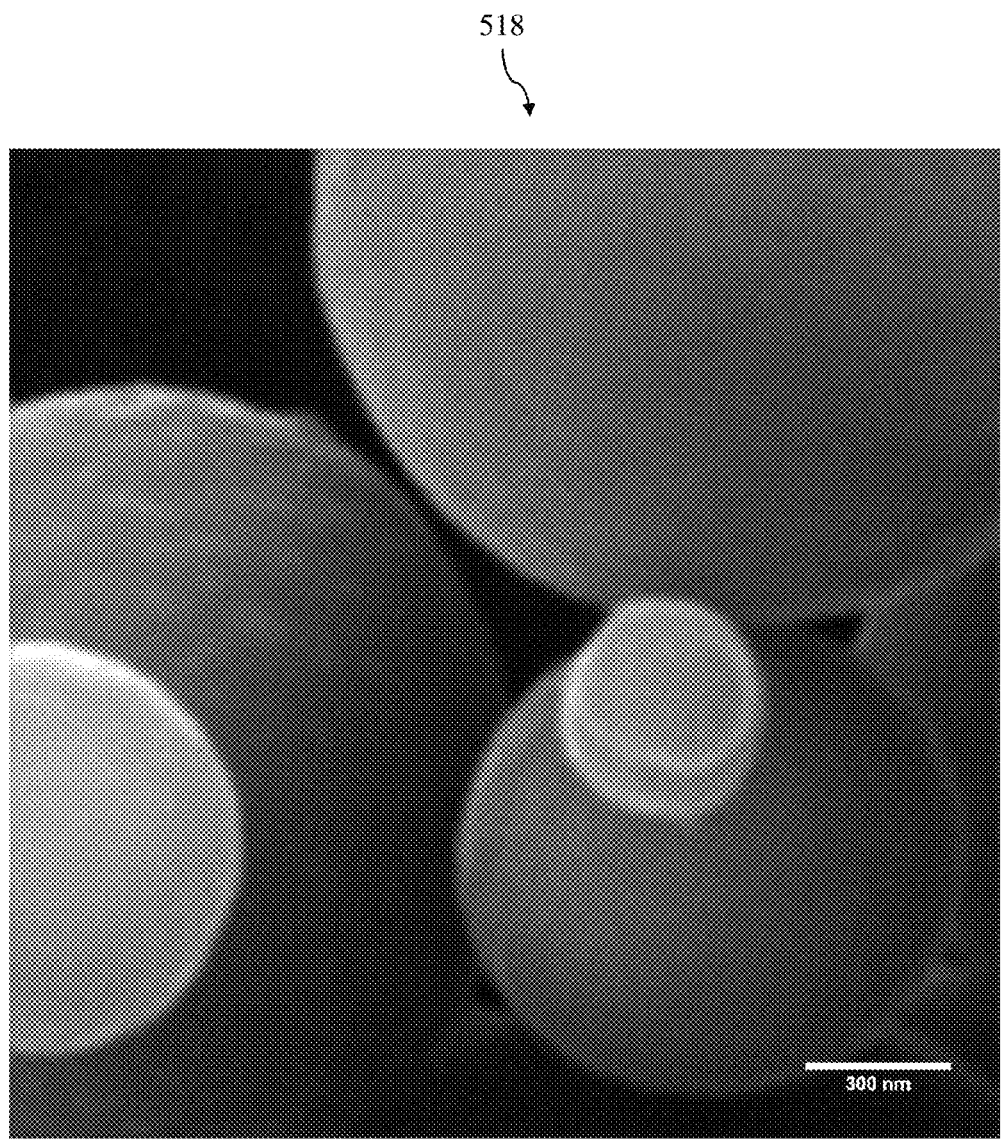
FIG. 5A depicts a captured sample image of a sample material taken by an observation device, according to embodiments.
Figure 5B:
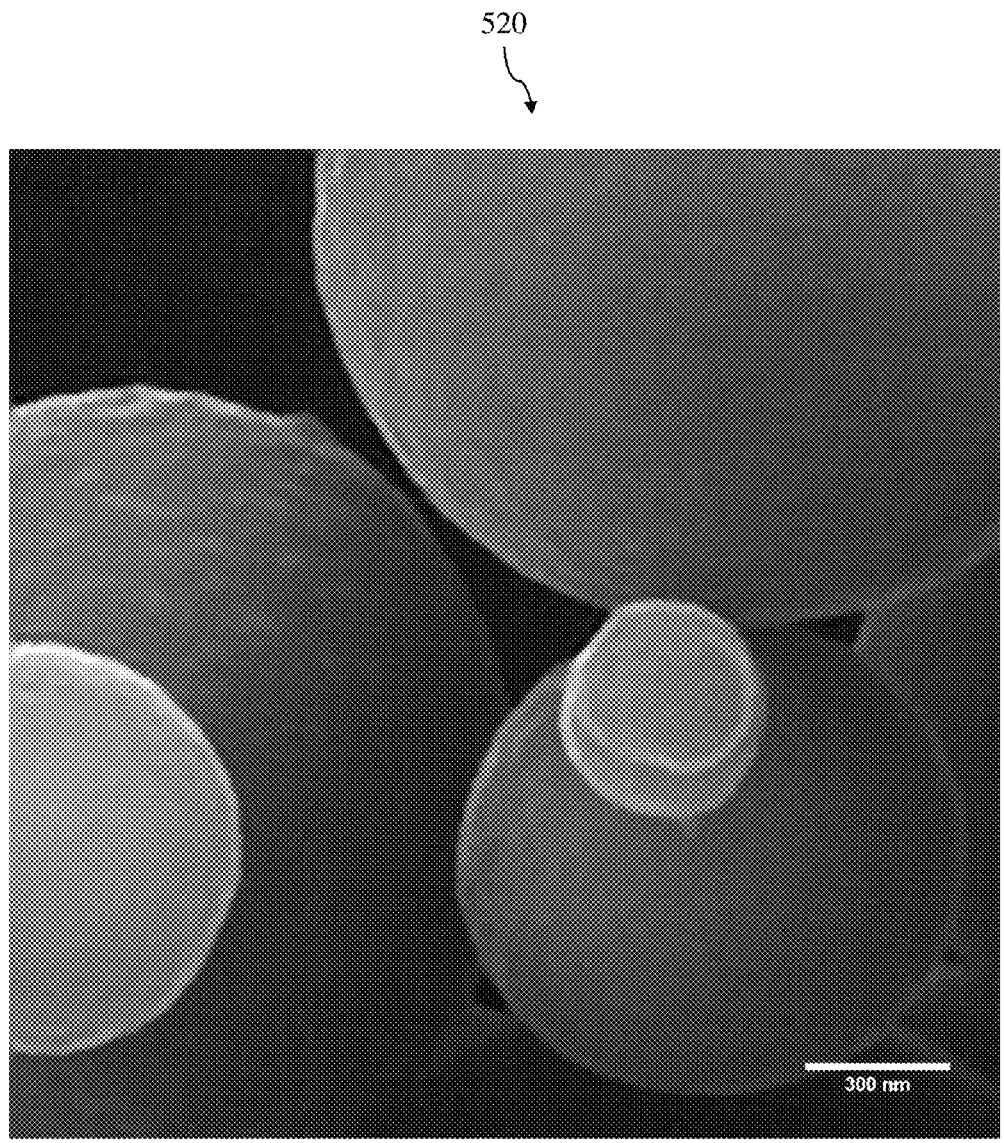
FIG. 5B depicts a restored sample image of the sample material based on the determined PSF, according to embodiments.
Figure 5C:
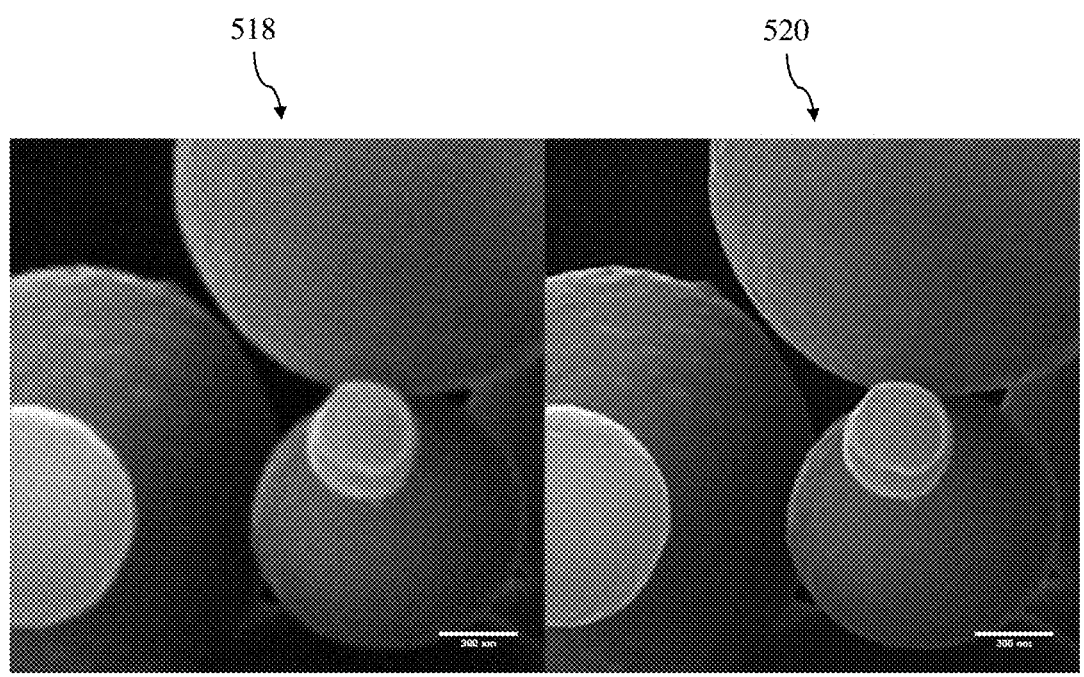
FIG. 5C depicts a side-by-side comparison image of the captured sample image of FIG. 5A and the restored sample image of FIG. 5B, according to embodiments.

FIGS. 5A-5C depict the process 300 (see, FIG. 3) of restoring an images using a determined point spread function (PSF) of a charged particle beam of an observation device (e.g., microscope). It is understood that the images depicted in FIGS. 5A-5C and the elements, compounds, and/or samples associated with these images are a non-limiting examples of the images and/or output feedback that may be produced restoring an image using the process 300. Additionally, and as discussed herein in detail below, the images depicted in FIGS. 5A-5C may be produced, analyzed, manipulated, and/or processed using a computer device and program product stored on the computer device that is configured to perform the operations of process 300 for restoring an image using a determined PSF.

FIG. 5A depicts a sample image 518 of a sample material. The sample image 518 is captured using the charged particle beam of the observation device, substantially similar to the charged particle beam and/or observation device discussed herein. Specifically, the captured sample image 518 may be captured using the same observation device and the charged particle beam, under substantially similar operational characteristics, as the captured calibration image 402 shown in FIG. 4B, for example. The operational characteristics for the observation device used to capture the sample image 518 may be substantially similar to the observation device used to capture the calibration image 402 so the determined PSF for the observation device may be utilized to restore the sample image 518, as discussed herein. The operational characteristics may be identical, or alternatively, may be substantially similar, such that the change in the operational characteristics between capturing the calibration image 402 and capturing the sample image 518 are so minimal that the alterations, effects or changes to the captured images are negligible. The operational characteristics may include, but are not limited to, a beam size of the charged particle beam, an intensity of the charged particle beam, a working distance between the objective lens and the sample to be captured (e.g., predetermined reference structure, sample material), an angular position of the charged particle beam with respect to the sample, and any other operational characteristic that may affect the PSF of the observation device.

As discussed herein, the sample material used to capture sample image 518 may be distinct from other materials, elements, compounds, and/or samples used to determine the PSF of the observation device. That is, the sample material may be distinct from the predetermined reference structure selected and used to determine the PSF, as discussed herein. Continuing the example from above, the predetermined reference structure used to determine the PSF may be gold (Au) (see, FIG. 4A). The sample material shown in FIG. 5A may include a sample of the compound iron oxide (FeO). Specifically, the sample material may be iron oxide, and the observation device may capture the sample image 518 that depicts various features or particles of the iron oxide. Although a chemical compound is shown in FIG. 5A, it is understood that various elements, compounds, tissues, and/or samples may be used as a sample material. Capturing the sample image 518 shown in FIG. 5A may correspond to operation 302 of process 300 shown in FIG. 3.

FIG. 5B depicts a restored sample image 520 of the sample material. Specifically, FIG. 5B depicts a restored sample image 520 based on the sample image 518 of the sample material captured using the observation device. The restored sample image 520 may be generated after processing, analyzing, and/or altering sample image 518 using operations of process 300. In a non-limiting example, sample image 518 of sample material is provided and/or obtained on a computer device including program product configured to restore sample image 518 to produce or generate restored sample image 520. In the non-limiting example sample image 518 may undergo a deconvolution process. Specifically, sample image 518 may undergo the deconvolution process, where the computer device and program product of the computer device utilize the determined PSF for the observation device to deconvolute the sample image 518 according to the determined PSF. Deconvoluting (e.g., restoring) sample image 518 to form restored sample image 520 shown in FIG. 5B may include smoothing, sharpening, de-blurring, and/or otherwise improving the portions of the sample image 518 that are associated with and/or created by the determined PSF of the observation device. Restored sample image 520 of the sample material shown in FIG. 5B, may include a higher image resolution and/or a higher image clarity than the captured sample image 518. Briefly turning to FIG. 5C, a side-by-side comparison of the sample image 518 and the restored sample image 520 depicts the improved resolution and clarity of the restored sample image 520 over the captured sample image 518. Restoring sample image 518 using the deconvolution process to produce or generate the restored sample image 520 shown in FIG. 5B may correspond to operation 304 of process 300 shown in FIG. 3.

Although discussed herein as a sample of a predetermined reference structure captured to form calibration image, it is understood that various other elements, compounds, components and/or structures may be examined and used to predict the point spread function (PSF) of a charged particle beam of an observation device. In non-limiting examples, the sample used to generate, obtain, and/or capture the calibration image may include lines etched on a silicon wafer, squares patterned out of copper or any other component or structure that may have a reasonably defined and/or clear structure and/or detectable shape characteristics (e.g., perimeter).

Observation Device Operational Performance Process

Figure 6:
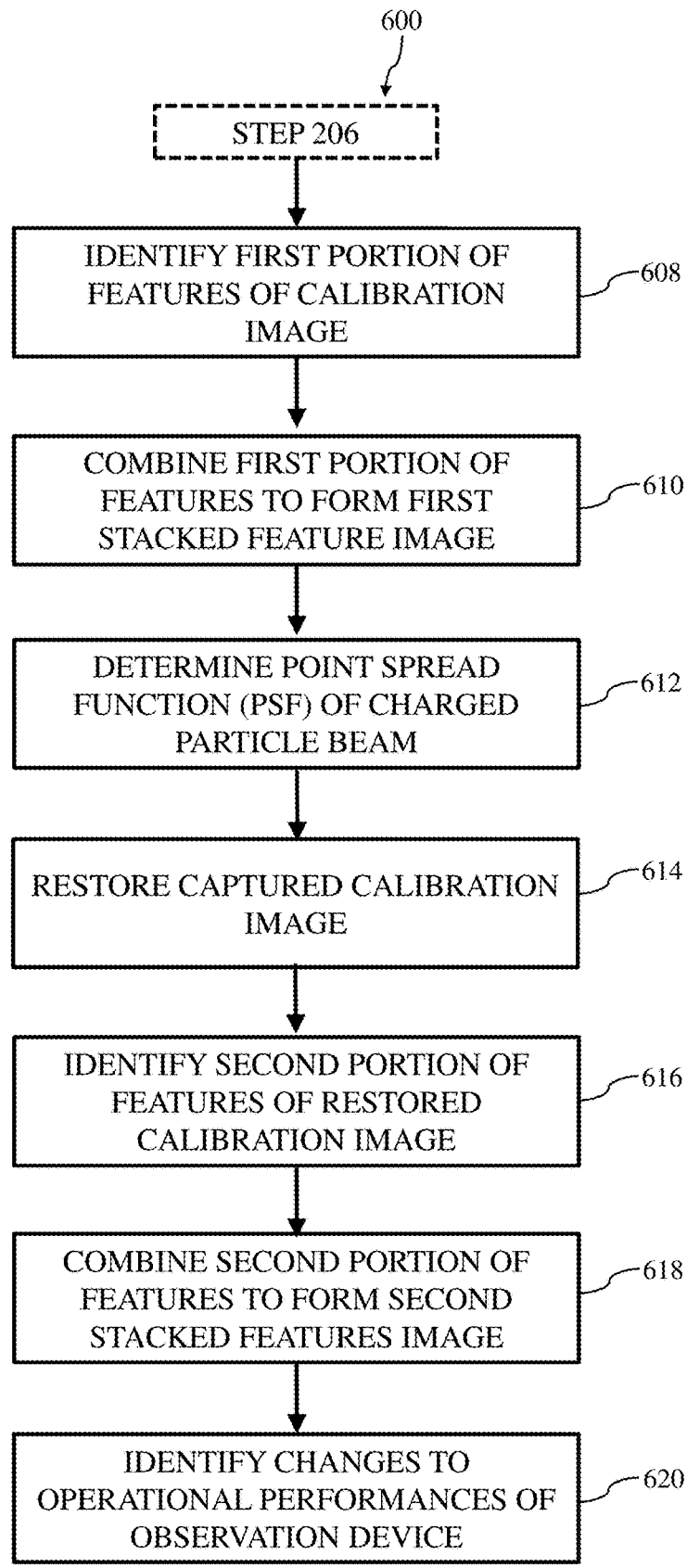
FIG. 6 depicts a method for analyzing operational performances for an observation device, according to embodiments.

FIG. 6 depicts an example process 600 for processing images. Specifically, FIG. 6 depicts a flowchart depicting one example process 600 for processing images to analyze operational performances of an observation device (e.g., microscope, SEM 100 (see, FIG. 1)). As shown in FIG. 6, the initial steps or operations of process 600 for processing images to analyze operational performances of an observation device may be similar or identical to operations 202, 204 and 206 discussed herein with respect to FIG. 2. That is, operation 202 (e.g., select predetermined reference structure), operation 204 (e.g., obtain reference image of predetermined reference structure), and operation 206 (e.g., capture calibration image of predetermined reference structure) of process 200 for processing images to determine a point spread function (PSF) for a charged particle beam of an observation device, may be used and/or repeated in process 600 prior to performing operations 608-620, as discussed herein. Redundant explanation of these operations is omitted herein for clarity.

In operation 608, a first portion of features of the plurality of features depicted in the calibration image may be identified. The first portion of features of the plurality of features in the calibration image that may be identified includes a feature size that may be substantially similar to the known feature size of the predetermined reference structure, and a feature shape that may be substantially similar to the known feature shape of the predetermined reference structure. Identifying the first portion of features may include analyzing each individual feature of the plurality of features of the calibration image, and determining shape characteristics for each individual feature of the calibration image. Once the shape characteristics are determined, the feature size and the feature shape for each feature of the plurality of features depicted in the calibration image may be determined. The determined feature size and determined feature shape for each feature of the plurality of features depicted in the calibration image may then be compared to the known feature size and known feature shape of the predetermined reference structure to determine if the feature size and feature shape for each feature of the plurality of features depicted in the calibration image is substantially similar to the known feature size and known feature shape of the predetermined reference structure. The features that include a feature size and feature shape substantially similar to the known feature size and known feature shape of the predetermined reference structure may form the identified first portion of the plurality of features depicted in the calibration image. Distinct features that include a feature size and feature shape distinct from the known feature size and known feature shape of the predetermined reference structure may be discarded from further use and/or analysis.

In operation 610, the identified first portion of features of the plurality of features depicted in the calibration image are combined. The first portion of features are combined to form a first stacked feature image of all the features that make up the identified first portion of features. More specifically, once the first portion of features are identified (e.g., operation 608), the first portion of features of the plurality of features depicted in the calibration image may be isolated from distinct features of the plurality of features that are not included in the identified first portion of features. As discussed above, these distinct features may include features depicted in the calibration image that include a feature size and feature shape distinct from the known feature size and known feature shape of the predetermined reference structure. In a non-limiting example, these may be features that are depicted as grouped and/or clumped together, such that multiple features appear to be a single mass in the calibration image, and therefore difficult to detect the individual feature size or feature shape for each of the grouped features. After isolating the identified first portion of features of the plurality of features depicted in the calibration image, each feature of the identified first portion of features may be cropped to form a first plurality of individual feature images for each feature of the identified first portion of features. That is, calibration image may be cropped and/or cut into various individual feature images of the features included in the identified first portion of features. Once cropped, each of the first plurality of individual feature images may be aligned and subsequently layered, masked and/or stacked on top of one another, to form the first stacked feature image from the first plurality of individual feature images. As a result of aligning, layering, masking and/or stacking the individual feature images to produce the first stacked feature image, the first stacked feature image may depict a single feature made up of each individual feature image. Additionally by forming the stacked feature image, the stacked feature image provides or produces an image of a single feature with improved signal quality, signal-to-noise ratio, minimize contamination of the features forming the stacked feature image, and/or evens or levels inhomogeneity of the features and the feature characteristics (e.g., shape, size) of the features depicted in the calibration image.

In operation 612, a point spread function (PSF) of the charged particle beam is determined. Specifically, the PSF for the charged particle beam used to capture the calibration image (e.g., operation 206; see, FIG. 2) may be determined by comparing the reference image of the predetermined reference structure (e.g., operation 204; see, FIG. 2) with the first stacked feature image (operation 610). In determining the PSF, and specifically comparing the reference image with the first stacked feature image, the reference image of the predetermined reference structure may be layered and/or masked over the first stacked feature image, and the reference image of the predetermined reference structure may be aligned with the first stacked feature image, such that a center of the reference image is aligned with a center of the single feature (e.g., particle) depicted in the first stacked feature image. Once aligned, the PSF may be determined by calculating a difference in feature size between the reference image of the predetermined reference structure and the single feature depicted in the first stacked feature image, and storing the calculated difference in feature size. Additionally, the PSF may be determined by calculating a difference in feature shape between the reference image of the predetermined reference structure and the single feature depicted in the first stacked feature image, and storing the calculated difference in the feature shape.

In operation 614, the calibration image captured in operation 206 (see, FIG. 2) may be restored. Specifically, the captured calibration image may be restored using the determined PSF for the observation device generating the charged particle beam. The calibration image may be restored in operation 614 by performing various processes.

In a non-limiting example, the calibration image captured in operation 206 may first be deconvoluted using the determined PSF. That is, the determined PSF may be utilized to deconvolute the captured calibration image. Specifically, the PSF may be recalled, obtained and/or utilized to deconvolute the captured calibration image. The particles depicted in the captured calibration image may have depicted portions (e.g., edges, body) associated with and/or created by PSF. These depicted portions associated with and/or created by PSF may be restored during the deconvolution process. After the deconvolution process, the restored calibration image may be generated with identified portions, for example edges, of the features in the calibration image that are associated with and/or created by PSF, smoothed, sharpened, de-blurred and/or otherwise improved to more clearly define the shape characteristics (e.g., perimeter or edges) of the features in the restored calibration image. Additionally, other identified portions, for example the body, of the features in the restored calibration image associated with and/or created by PSF may also be smoothed, sharpened, de-blurred and/or otherwise improved to provide more detail and/or clarity in the restored sample image. As a result, the restored sample image of the sample material may include a higher image resolution and/or higher image clarity than the captured sample image of the sample material.

Operation 616 performed on the restored calibration image may be substantially similar to an operation previously performed in process 600. More specifically, in operation 616, a second portion of features of the plurality of features depicted in the restored calibration image (e.g., operation 614) may be identified in a similar manner or operation as the first portion of features identified in operation 608. However, the distinction over operation 608 is that the second portion of features identified in operation 616 are based on and/or identified from the restored calibration image, and not the captured calibration image (see, operation 204; see, FIG. 2). In a non-limiting example, the features forming the second portion of features identified in operation 616 may be substantially identical to the features forming the first portion of features identified in operation 608. In another non-limiting example, the features forming the second portion of features identified in operation 616 may include at least one distinct feature from the features forming the first portion of features identified in operation 608. The second portion of features identified from the restored calibration image may be greater than the first portion of features identified from the captured calibration image because of the improved and/or higher resolution and/or quality of the restored calibration image when compared to the captured calibration image.

Similar to operation 616, operation 618 performed using the identified second portion of the restored calibration image may be substantially similar to an operation previously performed in process 600. More specifically, in operation 618, the identified second portion of features of the plurality of features depicted in the restored calibration image (see, operation 614) are combined in a similar manner or operation as the identified first portion of features combined in operation 610. Additionally, the identified second portion of features are combined to form a second stacked feature image of all the features that make up the identified second portion of features, as similarly discussed herein with respect to the identified first portion of features being combined to form the first stacked feature image. However, the distinction over operation 610 is that the identified second portion of features combined to form the second stacked feature image in operation 616 are based on and/or identified from the restored calibration image, and not the captured calibration image (see, FIG. 2—operation 204).

In operation 620, changes to operational performance of the observation device may be identified. Specifically, after determining the PSF for the charged particle beam of the observation device and/or generating the first stacked feature image and the second stacked feature image, changes to the operational performance of the observation device may be identified. The obtained reference image of the predetermined reference structure, the first stacked feature image formed using the captured calibration image and the second stacked feature image formed using the restored calibration image may be compared, analyzed, and/or processed to identify and/or calculate changes to the operational performance of the observation device. Specifically, the determined PSF and/or the images may be compared, analyzed, and/or processed to more accurately determine the resolution of the observation device. In a non-limiting example, a beam profile for the charged particle beam of the observation device may be determined and/or known using the determined PSF. Once the beam profile for the charged particle beam is determined, the determined beam profile may be duplicated and displaced a determined distance such that the intensity value between the determined beam profile and the duplicate beam profile reaches a predetermined value or percentage (e.g., 75%) of the maximum value for each of the determined and duplicate beam profile. From analysis of the beam profiles, a resolution of the charged particle beam may be defined and/or determined.

In another non-limiting example, a profile of the first stacked feature image formed from the captured calibration image (e.g., operation 610) may be generated, and subsequently duplicated and displaced. A composite profile (e.g., sum of the generated profile and duplicated, displaced profile) for the first stacked features image may then be calculated. The lowest intensity between the two peaks (e.g., generated profile peak, duplicated, displaced profile peak) of the composite profile may be determined as a percentage of the maximum value of the peaks and/or the composite profile. Once the percentage of the lowest intensity is determined, a magnitude of displacement of the duplicated, displaced profile required to achieve a predetermined percentage between the lowest intensity and the maximum value of the composite profile may also be determined and/or calculated. This magnitude of displace may be used as a measure of the resolution of the charged particle beam of the observation device used to capture the calibration image.

In another non-limiting example, a profile may be generated for the first stacked feature image formed from the captured calibration image (e.g., operation 610) and a profile may also be generated for the second stacked feature image formed from the restored calibration image using the determined PSF (e.g., operations 614-618). Comparing the generated profile of the first stacked feature image with the profile of the second stacked feature image may determine how much resolution is improved by restoring images using the determined PSF. Additionally, each of the profiles may be duplicated, displaced, and analyzed to determine a displacement distance to achieve a percentage change in intensity between the peak of the profile and the lowest intensity point, as discussed above with respect to the profile of the first stacked feature image formed from the captured calibration image. The difference in the determined displacement distance for the profile of the first stacked feature image and the determined displacement distance for the profile of the second stacked feature image may be compared to establish an improvement in resolution from the captured calibration image to the restored calibration image.

The profiles discussed in the non-limiting examples above may be line profiles of the feature depicted in the stacked feature image. Specifically, the profiles may refer to two-dimensional line plots or profiles depicting an intensity of the feature shown in the stacked feature image(s). The profiles, for example, may be substantially bell-curved in shape.

Additionally, operations 202-206 and 608-618 may be performed on a predetermined schedule (e.g., daily, weekly, monthly and so on) under identical operational characteristics (e.g., similar sample, similar beam intensity/voltage, similar working distance and so on) for the observation device. In the non-limiting example, the images for each performance of the operations may be stored, and later compared and analyzed to determine if the operational performance of components of the observation device may be underperforming and/or degrading over time and/or use of the observation device. The degradation or changes to the operational performance for components of the observation device may include, but are not limited to, changes to a beam size of the charged particle beam, changes in the working distance between an objective lens in the observation device and the imaged sample (e.g., predetermined reference structure), change in angular position of charged particle beam with respect to the imaged sample, change in the intensity of the charged particle beam, changes to an energy of the changed particle beam and the like. Each of these examples, if detected, may provide information relating to the change in operational performance for at least one component of the observation device. Additionally, identifying the changes to the operational performance may provide a check or quality control for sample images that are taken using the observation device for purposes of further analysis and/or examination. Comparing, processing and/or analyzing these images to identify operational performance changes may be completed using the computer device discussed herein.

FIGS. 7A-7H depict the process 600 (see, FIG. 6) of processing images to analyze operational performances of an observation device (e.g., microscope, SEM 100). It is understood that the images depicted in FIGS. 7A-7H and the elements associated with these images are a non-limiting examples of the images and/or output feedback that may be produced when determining the point spread function (PSF) and analyzing the operational performances of the observation device using the process 600. Additionally, and as discussed herein in detail below, the images depicted in FIGS. 7A-7H may be produced, analyzed, manipulated and/or processed using a computer device and program product stored on the computer device that is configured to perform the operations of process 600.

Initially, it is noted that images depicted in FIGs.-7A-7H may be substantially similar to those previously discussed herein with respect to FIGS. 4A-4I. Specifically, and as a result of process 600 including operations 202-206 of process 200, obtained reference image 400 shown in FIGS. 7C and 7H, and captured calibration image 402 shown in FIGS. 7A and 7F may be substantially similar or identical to obtained reference image 400 and captured calibration image 402 discussed herein with respect to FIGS. 4A-4I. It is understood that the feature of the predetermined reference structure (and features of other images discussed below) may refer to a particle of the predetermined reference structure or material (e.g., gold). As such, the terms "feature" and "particle" may be interchangeable with respect to the discussion of FIGS. 7A-7H. The obtained reference image 400 shown in FIGS. 7C and 7H of the predetermined reference structure may correspond to operations 202 and 204 of process 200 shown in FIG. 2. Additionally, captured calibration image 402 of the predetermined reference structure shown in FIGS. 7A and 7F may correspond to operations 206 of process 200 shown in FIG. 2. As such, it is understood that similarly numbered and/or named components may function in a substantially similar fashion. Redundant explanation of these components has been omitted for clarity.

Figure 7A:
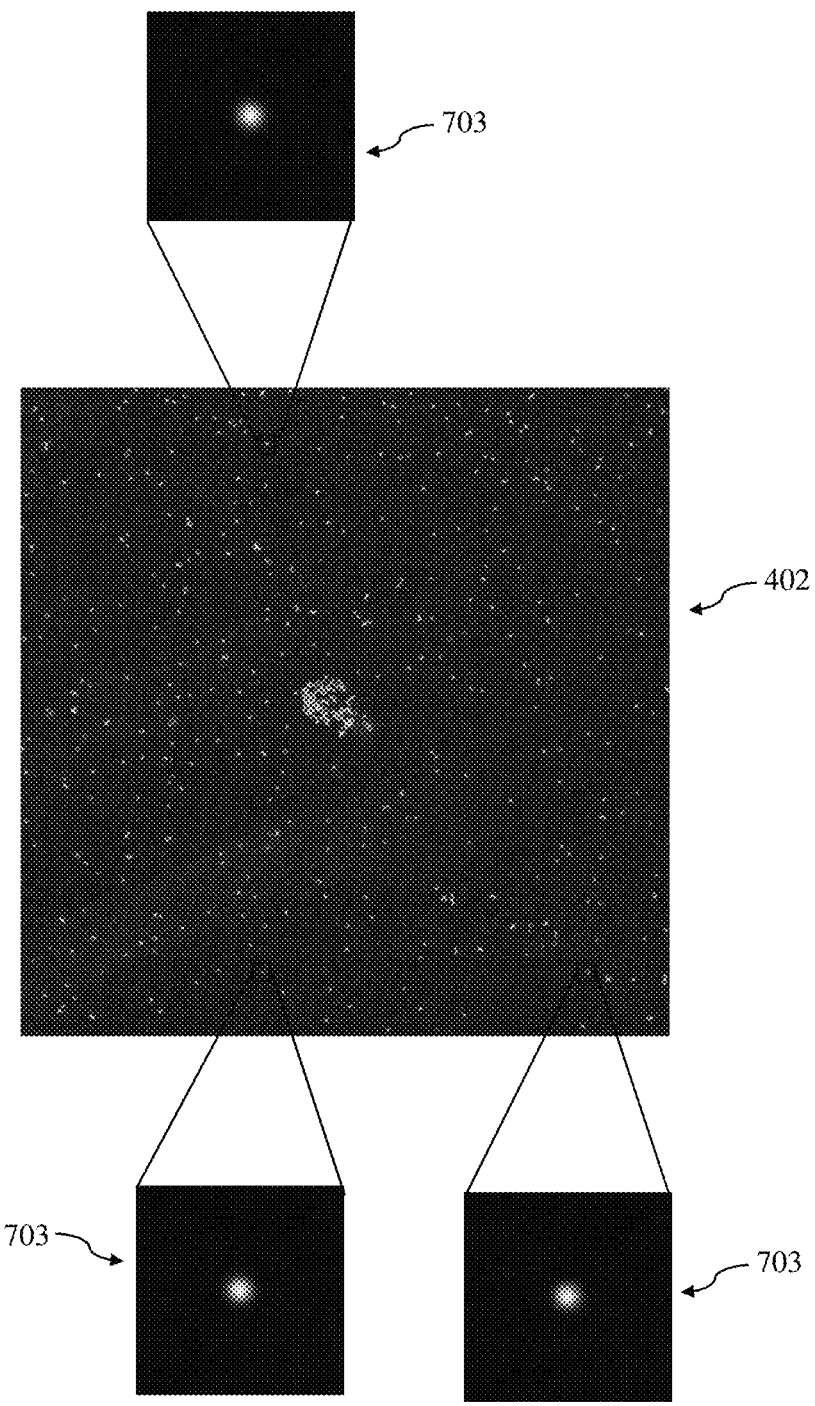
FIG. 7A depicts a captured calibration image and various individual feature images for particles included in an identified first portion of features depicted in the calibration image, according to embodiments.

FIG. 7A depicts the captured calibration image 402 and various individual feature images 703 for particles included in an identified first portion of features depicted in the calibration image 402. That is, the individual feature images 703 may be images of particles that have been identified as a first portion of features of the sample predetermined reference structure that include a feature size and feature shape that may be substantially similar to the known feature size and shape, respectively, of the predetermined reference structure. The particles depicted in the individual feature image 703 may be identified by analyzing each individual particle of the plurality of features of the calibration image 402, and determining shape characteristics for each individual particle of the calibration image 402. Once the shape characteristics are determined, the feature size and the feature shape for each particle of the plurality of features depicted in the calibration image 402 may be determined. The determined feature size and determined feature shape for each particle of the plurality of features depicted in the calibration image may then be compared to the known feature size and known feature shape of the predetermined reference structure to determine if the feature size and feature shape for each particle of the plurality of features depicted in the calibration image 402 is substantially similar to the known feature size and known feature shape of the predetermined reference structure. The particles that include a feature size and feature shape substantially similar to the known feature size and known feature shape of the predetermined reference structure may form the identified first portion of the plurality of features depicted in the calibration image 402. Although only three individual feature images 703 are depicted, it is understood that more particles may be identified and included in the first portion of the plurality of features of the predetermined reference structure that have the desired feature size and feature shape, as discussed above. The number of identified particles shown in the individual feature images 703 is merely exemplary and is not limiting to the number of particles that may be identified. As discussed herein, a computer device that receives the calibration image may perform the operations to identify the portion of features that have similar feature sizes and feature shapes as the predetermined reference structure. Identifying the particles depicted in the individual feature images 703 shown in FIG. 7A may correspond to operation 608 of process 600 shown in FIG. 6.

Figure 7B:
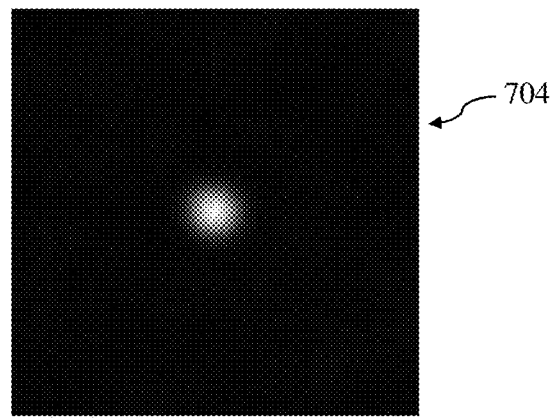
FIG. 7B depicts a first stacked feature image formed from particles of the captured calibration image of FIG. 7A, according to embodiments.

FIG. 7B depicts a first stacked feature image 704. The first stacked feature image 704 may be a combination of the identified first portion of features of the predetermined reference structure depicted in the calibration image 402 that have substantially similar feature sizes and particles shapes as the particles of the predetermined reference structure. Calibration image 402 may be cropped and/or cut into various individual feature images 703 (see, FIG. 7A) of the particles included in the identified first portion of features of the predetermined reference structure. Once cropped, each of the first plurality of individual feature images 703 may be aligned and subsequently layered, masked and/or stacked on top of one another, to form the first stacked feature image 704 from the plurality of individual feature images 703. As a result of aligning, layering, masking and/or stacking the individual feature images 703 to produce the first stacked feature image 704, the first stacked feature image 704 may depict a single particle made up of each individual feature image 703. The cropping, aligning, layering, masking, stacking and/or combining of the individual feature images 703 taken from the calibration image 402 to form the first stacked feature image 704 may be performed using a computer device and program product stored on the computer device configured to perform these processes. Combining the identified first portion of features depicted in the individual feature images 703 to form the first stacked feature images 704 shown in FIG. 7B may correspond to operation 610 of process 600 shown in FIG. 6.

Figure 7C:
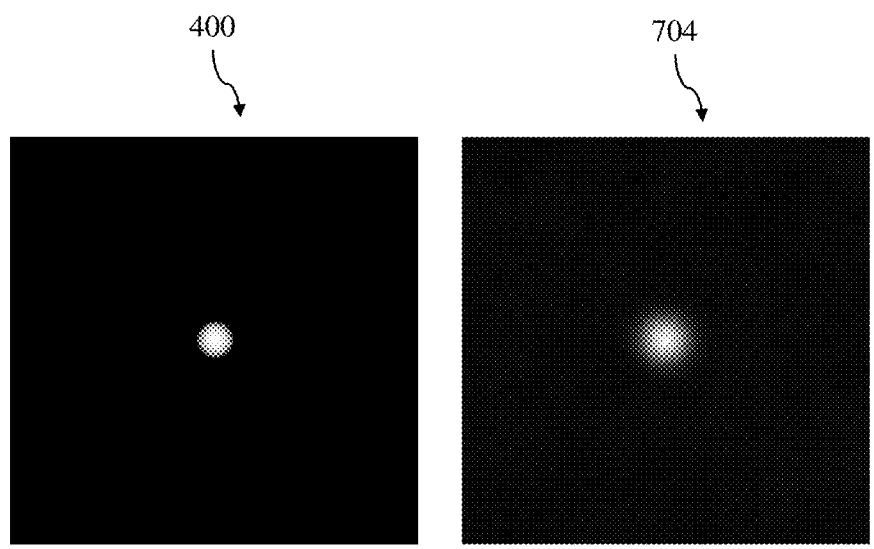
FIG. 7C depicts a side-by-side comparison image of the reference image of FIG. 4A and the first stacked feature image of FIG. 7B, according to embodiments.

FIG. 7C depicts a side-by-side comparison of the reference image 400 of the predetermined reference structure, and the first stacked feature image 704 of the predetermined reference structure. As shown in FIG. 7C, the particle depicted in the first stacked feature image 704 may have a greater diameter and/or size than the particle depicted in the reference image 400; even though the particles in the calibration image 402 used to generate or form the first stacked feature image 704 were substantially similar in size as the particle depicted in the reference image 400. Additionally, the shape of the particle depicted in the first stacked feature image 704 may distinct and/or less uniform than the shape of the particle depicted in the reference image 400. Finally, as shown in FIG. 7C, a "halo," blurred edge and/or edge-color distortion may be depicted in the first stacked feature image 704. The difference in size, shape and image distortion (e.g., halo) may be the effects of the point spread function (PSF) associated with the charged particle beam of the observation device.

Figure 7D:
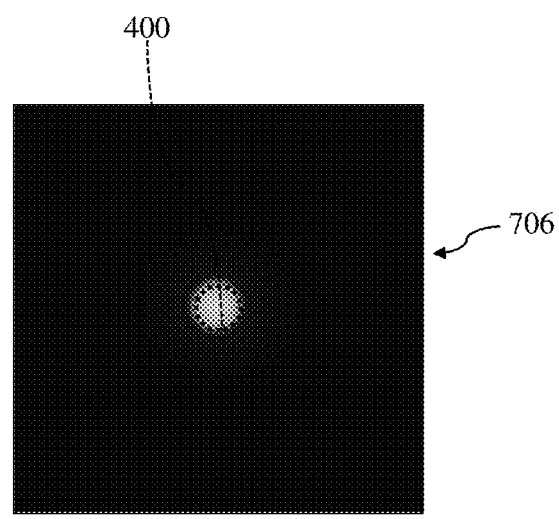
FIG. 7D depicts an overlay image of the obtained reference image of FIG. 4A and the first stacked feature image of FIG. 7B, according to embodiments.

FIG. 7D depicts an overlay image 706 of the reference image 400 and the first stacked feature image 704 of FIG. 7B. Overlay image 706 may be formed by comparing the reference image 400 and the first stacked feature image 704. Specifically, overlay image 706 may be generated and/or produced by aligning, layering, masking, stacking and/or combining the reference image 400 and the first stacked feature image 704 to form a single particle depicted in overlay image 706. As shown in the non-limiting example of FIG. 7D, color intensity of the particle depicted in overlay image 706 may vary. Specifically, the color, light, and/or illumination intensity of the particle depicted in overlay image 706 may vary as the distance from the center of the particle increases. In the non-limiting example shown in FIG. 7D, a solid bright color or light may represent the portion of the particle depicted in the reference image 400 (also shown in phantom) that matches and/or corresponds to as similar portion of the particle depicted in the first stacked feature image 704. Moving away from the center of the particle shown in overlay image 706 and the defined edges of the solid color or light, the color or light may fade or dim to a darker color or light, and/or the intensity of the color decreases (e.g., not as visible or bright). This portion of the overlay image 706 may be the "halo" found only around the particle depicted in the first stacked feature image 704. As a result, this portion of the overlay image 706 may indicate and/or depict the point spread function (PSF) associated with observation device. The overlay image 706 may be created and/or generated by a computer device and a computer program product stored on the computer device that may be configured to compare, align, layer, mask and/or stack the reference image 400 and the first stacked feature image 704.

In another non-limiting example (not shown), PSF may be determined and/or represented by a distinction of color in overlay image 706. That is, colors of particles or features in overlay image 706 may vary. In the non-limiting example, the color of the particle depicted in overlay image 706 may vary as the distance from the center of the particle increases. For example, a solid bright color (e.g., green) may represent the portion of the particle depicted in the obtained reference image 400 that matches and/or corresponds to as similar portion of the particle depicted in the stacked feature image 704. Moving away from the center of the particle shown in overlay image 706 and the defined edges of the solid bright color, the color fades to a darker color (e.g., red) and the intensity of the color decreases (e.g., not as visible).

Figure 7E:
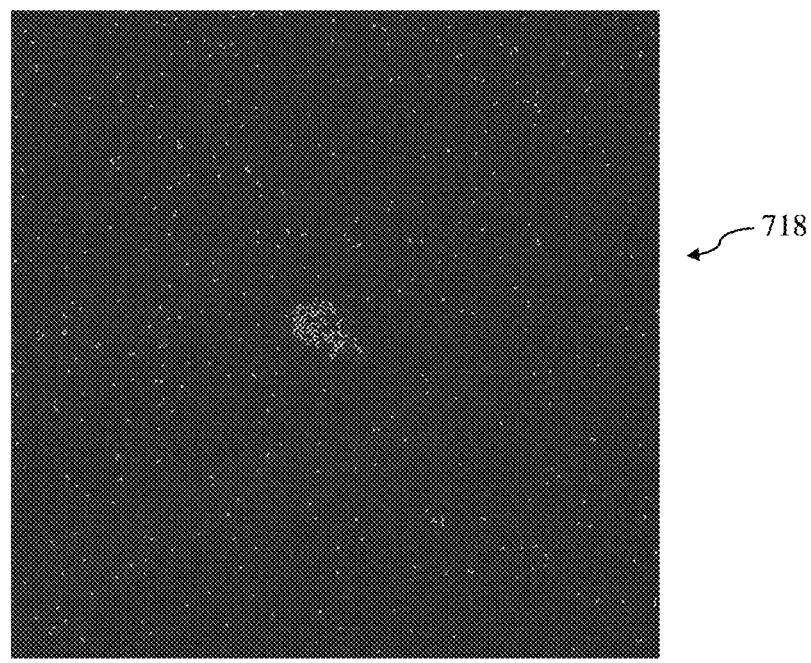
FIG. 7E depicts a restored calibration image of the predetermined reference using the determined PSF of FIGS. 4F-4I, according to embodiments.
Figure 7F:
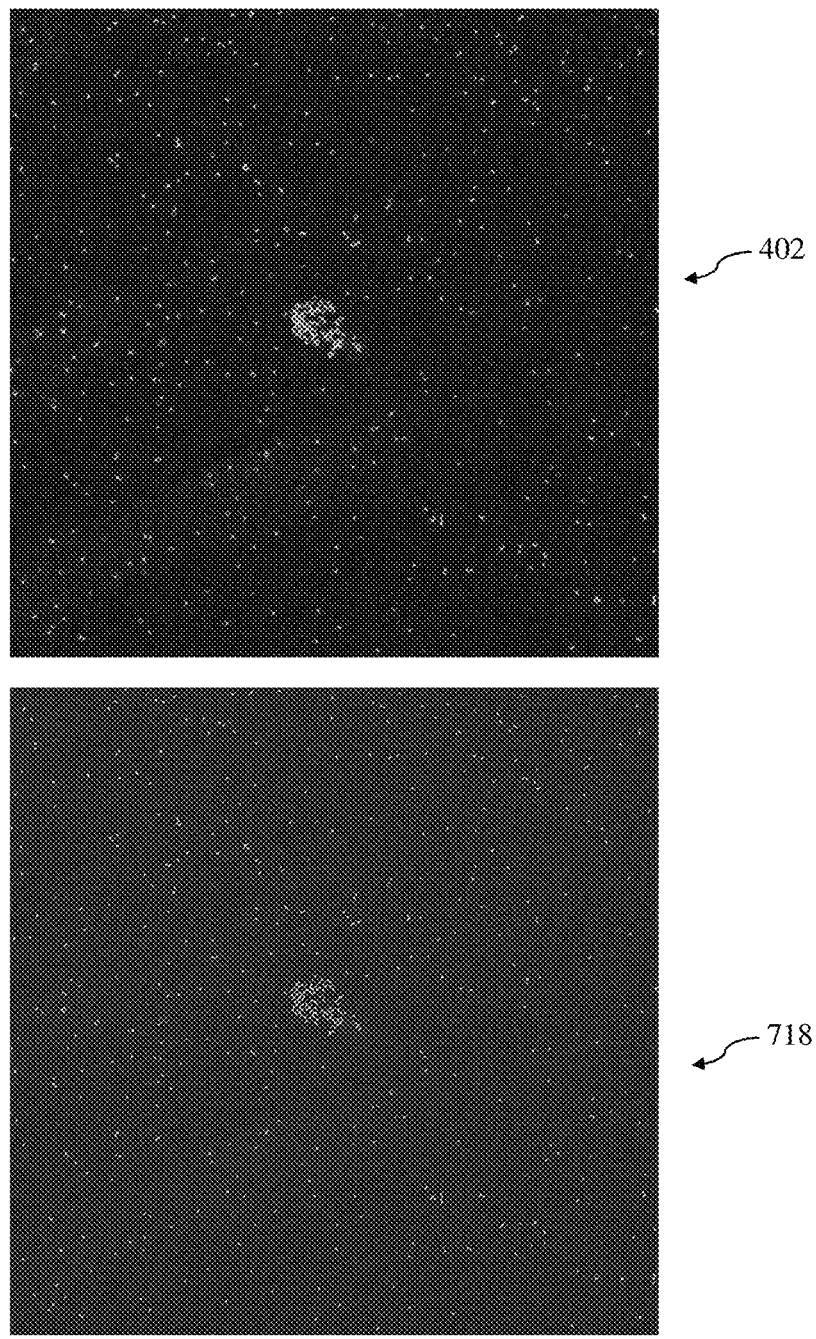
FIG. 7F depicts a side-by-side comparison image of the captured calibration image of FIG. 7A and the restored calibration image of FIG. 7E, according to embodiments.

FIG. 7E depicts a restored calibration image 718. Specifically, the captured calibration image 402 is restored using the determined PSF for the charged particle beam of the observation device to generate and/or produce the restored calibration image 718 depicted in FIG. 7E. The restored calibration image 718 may be generated after processing, analyzing and/or altering the captured calibration image 402. In a non-limiting example, the captured calibration image 402 is provided and/or obtained on a computer device including program product configured to restore the captured calibration image 402 to produce or generate the restored calibration image 718. In the non-limiting example the captured calibration image 402 may be undergo a deconvolution process. Specifically, the captured calibration image 402 may undergo the deconvolution process, where the computer device and program product of the computer device utilize the determined PSF for the observation device to deconvolute the captured calibration image 402 according to the determined PSF. Deconvoluting (e.g., restoring) the captured calibration image 402 to form the restored calibration image 718 shown in FIG. 7E may include smoothing, sharpening, de-blurring and/or otherwise improving the portions of the captured calibration image 402 that are associated with and/or created by the determined PSF of the observation device. Restored calibration image 718 shown in FIG. 7E, may include a higher image resolution and/or a higher image clarity than the captured calibration image 402. Briefly turning to FIG. 7F, a side-by-side comparison of the captured calibration image 402 and the restored calibration image 718 depicts the improved resolution and clarity of the restored calibration image 718 over the captured calibration image 402. Deconvoluting the captured calibration image 402 and restoring the captured calibration image 402 to produce or generate the restored calibration image 718 shown in FIGS. 7E and 7F may correspond to operation 614 of process 600 shown in FIG. 6.

Figure 7G:
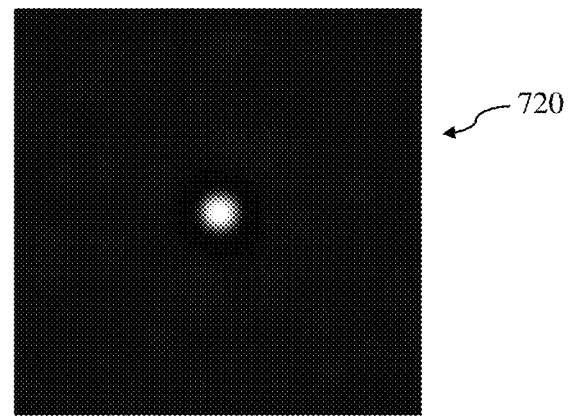
FIG. 7G depicts a second stacked feature image formed from particles of the restored calibration image of FIG. 7E, according to embodiments.

FIG. 7G depicts a second stacked feature image 720. The second stacked feature image 720 may be based on and/or generated by performing similar operations discussed herein on the restored calibration image 718. Specifically, the second stacked feature image 720 may be formed by performing similar operations (e.g., operations 608 and 610) discussed herein with respect to FIGS. 7A and 7B on the restored calibration image 718, instead of the captured calibration image 402. In a non-limiting example, a second portion of features depicted in the restored calibration image 718 may be identified in a similar manner and/or operation as the first portion of features discussed herein with respect to operation 608 of FIG. 6 and FIG. 7A. Once the second portion of features in the restored calibration image 718 are identified, the second portion of features may be cropped and/or cut from the restored calibration image 718 and formed into a second plurality of individual feature images, as discussed herein. Then, each of the second plurality of individual feature images of the identified second portion of features in the restored calibrated image 718 may be combined to form the second stacked feature image. As similarly discussed herein, combining the identified second portion of features, and the corresponding second plurality of individual feature images, to form the second stacked feature image may include aligned and subsequently layered, masked and/or stacked on top of one another each of the second plurality of individual feature images. As a result of aligning, layering, masking and/or stacking the second plurality of individual feature images, the second stacked feature image 720 may depict a single particle made up of each individual feature image from the identified second portion of features in the restored calibrated image 718. Identifying the second portion of features in the restored calibration image 718 and combining the identified second portion of features to form the second stacked feature images 720 shown in FIG. 7G may correspond to operations 616 and 618 of process 600 shown in FIG. 6.

Figure 7H:
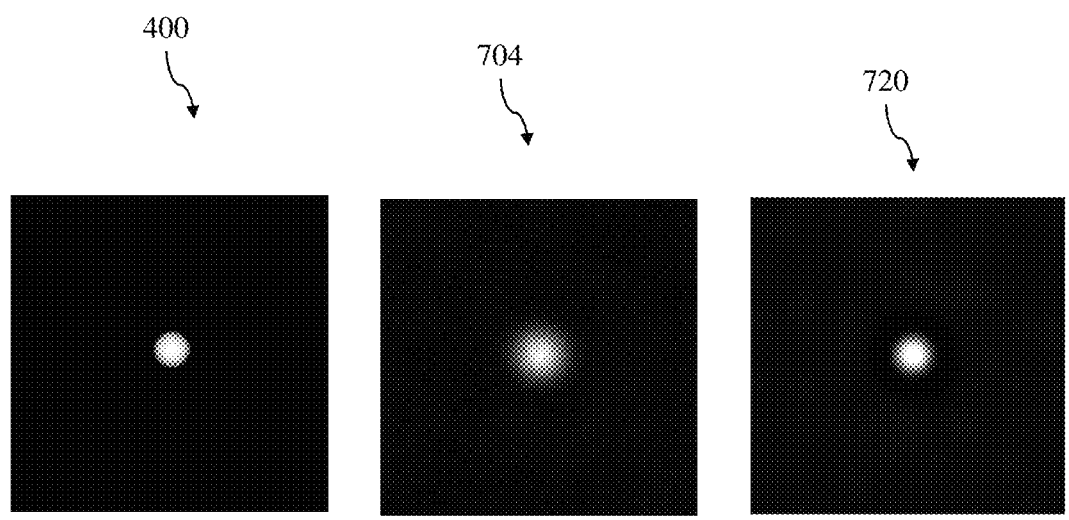
FIG. 7H depicts a side-by-side comparison image of the reference image of FIG. 4A, the first stacked feature image of FIG. 7B, and the second stacked feature image of FIG. 7G, according to embodiments.

FIG. 7H depicts a side-by-side comparison of the reference image 400 of the predetermined reference structure, the first stacked feature image 704 generated from the captured calibration image 402 and the second stacked feature image 720 generated from the restored calibration image 718. As shown in FIG. 7H, the particle depicted in the second stacked feature image 720 may be clearer, and closer in feature shape and/or feature size to the reference image 400 than the particle depicted in the first stacked feature image 704. That is, the second stacked feature image 720 may have greater clarity and may depict a particle having a smaller feature size and more uniform feature shape that than the particle depicted in the first stacked feature image 704. Additionally, the second stacked feature image 720 may depict a particle having a slightly larger feature size and slightly less uniform feature shape that than the particle depicted in the reference image 400.

Utilizing the reference image 400 of the predetermined reference structure, the first stacked feature image 704 generated from the captured calibration image 402 and the second stacked feature image 720 generated from the restored calibration image 718, changes to the operational performance of the observation device may be identified. Specifically, the images 400, 704, 720 shown in FIG. 7H may be compared, analyzed, and/or processed to identify and/or calculate changes to the operational performance of the observation device. These images 400, 704, 720 may be compared, analyzed, and/or processed by the computer device responsible for and/or configured to determine the PSF for the observation device and generate and/or form the stacked feature images 704, 720, as discussed herein. In a non-limiting example, images 400, 704, 720 may aid in determining a more accurate resolution of the observation device. As previously discussed herein with respect to operation 620 in FIG. 6, a number of profile plots based on at least one first stacked feature image 704 and/or second stacked feature image 720 may be generated, compared and/or analyzed to more accurately determine the resolution and/or the improvement of the resolution of the charged particle beam of the observation device. In a non-limiting example, a two-dimensional line profile plot may be generated for first stacked feature image 704 and second stacked feature image 720. These generated line profiles may be two-dimensional profiles that correspond to and/or correlate to the three-dimensional surface plot depicted in FIG. 3I, for example. As discussed herein, the generated line profiles for the first stacked feature image 704 and the second stacked feature image 720 may be duplicated, displaced a predetermined distance and analyzed to determine the percentage change between the lowest intensity point for each of the respective profiles and the highest peak or maximum point. From there, each duplicated, displaced line profile for each of the first and second stacked feature images 704, 720, respectively, may be displaced again to achieve a predetermined (e.g., desired) percentage change between the lowest intensity point for each of the respective profiles and the highest peak or maximum point. In the non-limiting example, the distance to displace the duplicated, displaced line profile for the first stacked feature image 704 to achieve the predetermined percentage change may be greater than the distance to displace the duplicated, displaced line profile for the second stacked feature image 720. The difference in the displacement distance between the first stacked feature image 704 and the second stacked feature image 720 to achieve the predetermined percentage change between the lowest intensity point and the highest peak may establish an improvement in the resolution between the first stacked feature image 704 and the second stacked feature image 720. In addition, difference in the displacement distance may also establish the improvement in resolution for the charged particle beam of the observation device when determining a point spread function (PSF) and utilizing the determined PSF to enhance and/or improve images captured using the observation device.

While one example of accurately determining the resolution and/or the determining the improvement of the resolution of the charged particle beam of the observation device is discussed herein with respect to FIGS. 7A-7H, it is understood that other examples and/or processes may achieve similar resolution determinations. That is, the various examples, processes and/or operations discussed herein with respect to operation 620 in FIG. 6 may be utilized and/or performed to accurately determine the resolution and/or the improvement of the resolution of the charged particle beam of the observation device.

In another non-limiting example, images 400, 704, 720 on a weekly basis, under identical operational characteristics (e.g., similar sample, similar beam intensity/voltage, similar working distance and so on) for the observation device. In the non-limiting example, the weekly obtained/formed images 400, 704, 720 may be stored, compared, and/or analyzed with each other and with previous week's images. Where a change in the images exists and/or a change in the PSF exists from week-to-week, it may be determined that the operational performance of components of the observation device may be underperforming and/or degrading over time and/or use of the observation device. In specific examples, where the PSF increases from a previous week, and the observation device is operating under identical operational characteristics, it may be determined that the charged particle beam of the observation device is degrading, the beam intensity is decreasing, and/or the sensors for determining and/or altering the function of the components of the observation device (e.g., lenses for beam size, platform responsible for positioning sample in similar working distance and so on) may be incorrect and/or registering improper data. By being able to identify changes to the operational performance of the observation device, the user of the observation device may be able to fix, adjust and/or correct problems with the observation device and ensure that each image taken with the observation device is of the highest quality and accuracy. Identifying changes to the operational performance of the observation device using images 400, 704, 720 shown in FIG. 7H, may correspond to operation 620 of process 600 shown in FIG. 6.

Computing Devices and Systems

Figure 8:
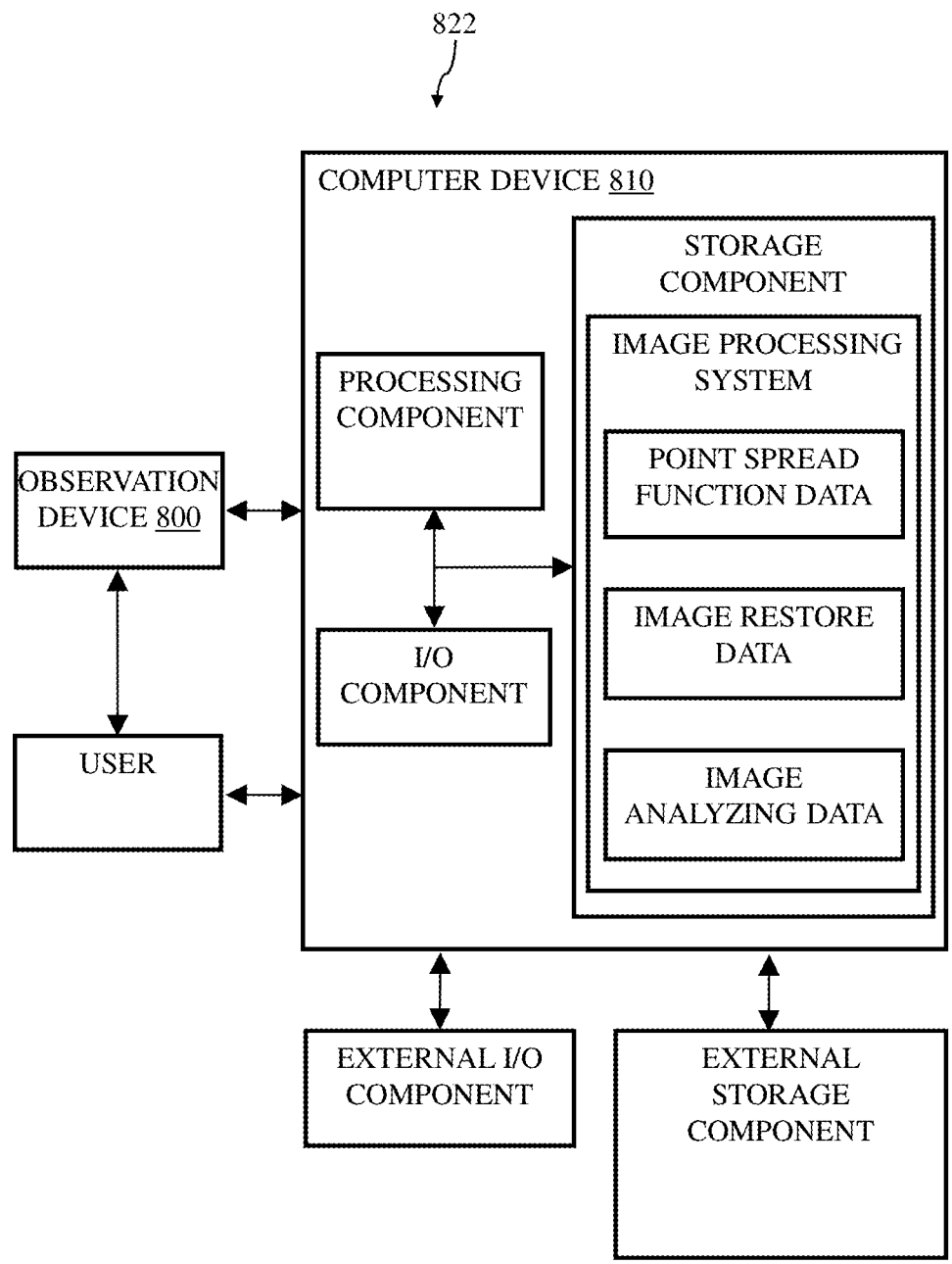
FIG. 8 depicts a schematic view of an image processing system including an observation device and a computer device including computer program product configured to process an image, according to embodiments.

FIG. 8 depicts an image processing system 822 including an observation device 800 and a computer device 810 including computer program product configured to process an image. The observation device 800 may be substantially similar to the observation device 100 shown and discussed herein with respect to FIG. 1. Additionally, the computer device 810 may be substantially similar to the computer device 110 shown in FIG. 1 and discussed herein with respect to FIGS. 1-7H.

The system 822 may comprise any type of computer device 810. To this extent, system 822 includes a computer device 810 that can perform the various processes described herein for processing images. In particular, computer device 810 is shown including an image processing system, which enables computer device 810 to perform the process of determining a point spread function (PSF) for the observation device 800, and the process of restoring sample images, as described herein with respect to FIGS. 2-5C.

Computer device 810 is shown including a memory or storage component, a processing component, an input/output (I/O) interface, and a bus. Further, computer device 810 is shown in communication with an external I/O device/resource and an external storage component. In general, processing component executes computer program code, such as the code in image processing system that is stored in storage component. While executing computer program code, processing component can read and/or write data to/from the storage components and/or I/O components. Bus provides a communications link between each of the components in computer device 810. I/O interface can comprise any device that enables a user to interact with computer device 810 or any device that enables computer device 810 to communicate with one or more other computing devices. External I/O component can be coupled to the system either directly or through I/O device.

In any event, computer device 810 can comprise any general purpose computing article of manufacture capable of executing computer program code installed thereon. However, it is understood that computer device 810 and image processing system are only representative of various possible equivalent computing devices that may perform the various processes of the disclosure. To this extent, in other embodiments, computer device 810 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer device 810 is only illustrative of various types of computer infrastructures for implementing the invention. For example, in an embodiment, computer device 810 comprises two or more computing devices that communicate over any type of wired and/or wireless communications link, such as a network, a shared memory, or the like, to perform the various processes of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Image processing system includes a point spread function (PSF) data, an image restore data, and image analyzing data. The data includes executable program code for allowing computer device 810 to perform the processes discussed herein. As should be appreciated, components of computer device 810 and image processing system may be located at different physical locations or at the same physical location.

Inputs/outputs to computer device 810, e.g., through external I/O components, may include communications between image processing system and users who utilizing and/or operating the observation device 800. Inputs/outputs to computer device 810 may provide computer device 810 and/or user of observation device 800 with feedback, images, and/or inputs/outputs when performing the processes discussed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices, such as computer device 810, from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While it is understood that the program product of the present invention may be manually loaded directly in a computer system via a storage medium such as a CD, DVD, etc., the program product may also be automatically or semi-automatically deployed into a computer system by sending the program product to a central server or a group of central servers. The program product may then be downloaded into client computers that will execute the program product. Alternatively the program product may be sent directly to a client system via e-mail. The program product may then either be detached to a directory or loaded into a directory by a button on the e-mail that executes a program that detaches the program product into a directory. Another alternative is to send the program product directly to a directory on a client computer hard drive.

Illustrations with respect to one or more implementations, alterations, and/or modifications can be made to the illustrated examples without departing from the spirit and scope of the appended claims. In addition, while a particular feature may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. A method of analyzing operational performances of an observation device, the method comprising:
   selecting a predetermined reference structure, the predetermined reference structure having a known feature size and a known feature shape;
   obtaining a reference image of the predetermined reference structure;
   capturing a calibration image of the predetermined reference structure using a charged particle beam of the observation device, the calibration image including a plurality of features of the predetermined reference structure;
   identifying a first portion of the plurality of features of the calibration image that include:
      a feature size substantially similar to the known feature size of the predetermined reference structure; and
      a feature shape substantially similar to the known feature shape of the predetermined reference structure;
   combining the identified first portion of the plurality of features of the calibration image to form a first stacked feature image;
   determining a point spread function (PSF) of the charged particle beam by comparing the reference image of the predetermined reference structure with the stacked feature image;
   restoring the captured calibration image of the predetermined reference structure using the determined PSF, the restored calibration image having a higher image resolution and clarity than the captured calibration image of the predetermined reference structure;
   identifying a second portion of the plurality of features of the restored calibration image that include:
      a feature size substantially similar to the known feature size of the predetermined reference structure; and
      a feature shape substantially similar to the known feature shape of the predetermined reference structure;
   combining the identified second portion of the plurality of features of the calibration image to form a second stacked feature image; and
   identifying changes to the operational performances of the observation device by comparing the reference image of the predetermined reference structure with the second stacked feature image.

2. The method of claim 1, wherein the identified second portion of features includes at least one distinct feature than the identified first portion of features.

3. The method of claim 1, wherein the identified second portion of features includes identical features as the identified first portion of features.

4. The method of claim 1, wherein identifying the first portion of the plurality of features of the calibration image comprises:
   analyzing each of the plurality of features of the calibration image;
   determining shape characteristics for each of the plurality of features of the calibration image;
   determining the feature size of each of the plurality of features of the calibration image based on the shape characteristics;
   determining the feature shape for each of the plurality of features of the calibration image based on the shape characteristics;
   comparing the feature size of each of the plurality of features of the calibration image to the known feature size of the predetermined reference structure to determine if the feature size of each of the plurality of features of the calibration image are substantially similar to the known feature size of the predetermined reference structure; and
   comparing the feature shape of each of the plurality of features of the calibration image to the known feature shape of the predetermined reference structure to determine if the feature shape of each of the plurality of features of the calibration image are substantially similar to the known feature shape of the predetermined reference structure.

5. The method of claim 1, wherein identifying the second portion of the plurality of features of the restored calibration image comprises:
   analyzing each of the plurality of features of the restored calibration image;
   determining shape characteristics for each of the plurality of features of the restored calibration image;
   determining the feature size of each of the plurality of features of the restored calibration image based on the shape characteristics;
   determining the feature shape for each of the plurality of features of the restored calibration image based on the shape characteristics;
   comparing the feature size of each of the plurality of features of the restored calibration image to the known feature size of the predetermined reference structure to determine if the feature size of each of the plurality of features of the restored calibration image are substantially similar to the known feature size of the predetermined reference structure; and
   comparing the feature shape of each of the plurality of features of the restored calibration image to the known feature shape of the predetermined reference structure to determine if the feature shape of each of the plurality of features of the restored calibration image are substantially similar to the known feature shape of the predetermined reference structure.

6. The method of claim 1, wherein combining the identified first portion of the plurality of features of the calibration image to form the first stacked feature image comprises:
   isolating the identified first portion of the plurality of features of the calibration image that include:
      a feature size substantially similar to the known feature size of the predetermined reference structure; and
      a feature shape substantially similar to the known feature shape of the predetermined reference structure;
   cropping each feature of the identified first portion of the plurality of features of the calibration image to form a first plurality of individual feature images for each feature of the identified first portion of the plurality of features of the calibration image; and
   layering each of the first plurality of individual feature images to form the first stacked feature image from the first plurality of individual feature images, the first stacked feature image depicting a single feature in the first stacked feature image.

7. The method of claim 6, wherein comparing the reference image of the predetermined reference structure with the first stacked feature image comprises:
   layering the reference image of the predetermined reference structure over the first stacked feature image; and
   aligning the reference image of the predetermined reference structure with the depicted, single feature of the first stacked feature image.

8. The method of claim 7, wherein determining the PSF of the charged particle beam comprises:
   calculating a difference in feature size between the reference image of the predetermined reference structure and the depicted, single feature of the first stacked feature image;
   storing the calculated difference in feature size between the reference image of the predetermined reference structure and the depicted, single feature of the first stacked feature image created by the charged particle beam;
   calculating a difference in feature shape between the reference image of the predetermined reference structure and the depicted, single feature of the first stacked feature image; and
   storing the calculated difference in feature shape between the reference image of the predetermined reference structure and the depicted, single feature of the first stacked feature image created by the charged particle beam.

9. The method of claim 1, wherein combining the identified second portion of the plurality of features of the restored calibration image to form the second stacked feature image comprises:
   isolating the identified second portion of the plurality of features of the restored calibration image that include:
      a feature size substantially similar to the known feature size of the predetermined reference structure; and
      a feature shape substantially similar to the known feature shape of the predetermined reference structure;
   cropping each feature of the identified second portion of the plurality of features of the restored calibration image to form a second plurality of individual feature images for each feature of the identified second portion of the plurality of features of the restored calibration image; and
   layering each of the second plurality of individual feature images to form the second stacked feature image from the second plurality of individual feature images, the second stacked feature image depicting a single feature in the second stacked feature image.

10. The method of claim 9, wherein comparing the reference image of the predetermined reference structure with the second stacked feature image comprises:
    layering the reference image of the predetermined reference structure over the second stacked feature image; and
    aligning the reference image of the predetermined reference structure with the depicted, single feature of the second stacked feature image.

11. The method of claim 1, wherein identifying changes to the operational performance of the observation device comprising at least one of:
    determining changes to a beam size of the charged particle beam;
    determining changes in a working distance between an objective lens and the predetermined reference structure;
    determining changes in an angular position of the charged particle beam with respect to the predetermined reference structure;
    determining changes in an intensity of the charged particle beam; or
    determining changes in an energy of the charged particle beam.

12. The method of claim 1, wherein the known feature shape of the predetermined reference structure is one of:
    a circle,
    an oval,
    a triangle, or
    a quadrilateral.

13. The method of claim 1, wherein the known feature size of the predetermined reference structure is within a range between approximately 5 nanometers and approximately 30 nanometers.

14. An image processing system, the system comprising:
    an observation device for generating a charged particle beam; and
    a computer device in communication with the observation device, the computer device for performing a method for analyzing operational performances of the observation device comprising:
       selecting a predetermined reference structure, the predetermined reference structure having a known feature size and a known feature shape;
       obtaining a reference image of the predetermined reference structure;
       obtaining a calibration image of the predetermined reference structure using the charged particle beam of the observation device, the calibration image including a plurality of features of the predetermined reference structure;
       identifying a first portion of the plurality of features of the calibration image that include:
          a feature size substantially similar to the known feature size of the predetermined reference structure; and
          a feature shape substantially similar to the known feature shape of the predetermined reference structure;

combining the identified first portion of the plurality of features of the calibration image to form a first stacked feature image; and determining a point spread function (PSF) of the charged particle beam by comparing the reference image of the predetermined reference structure with the stacked feature image;

restoring the captured calibration image of the predetermined reference structure using the determined PSF, the restored calibration image having a higher image resolution and clarity than the captured calibration image of the predetermined reference structure;

identifying a second portion of the plurality of features of the restored calibration image that include:
- a feature size substantially similar to the known feature size of the predetermined reference structure; and
- a feature shape substantially similar to the known feature shape of the predetermined reference structure;

combining the identified second portion of the plurality of features of the calibration image to form a second stacked feature image; and identifying changes to the operational performances of the observation device by comparing the reference image of the predetermined reference structure with the second stacked feature image.

15. A computer program product stored on a non-transitory computer readable storage medium for performing a method for analyzing operational performances of an observation device, the computer program product comprising program code for:

selecting a predetermined reference structure, the predetermined reference structure having a known feature size and a known feature shape;

obtaining a reference image of the predetermined reference structure;

obtaining a calibration image of the predetermined reference structure using a charged particle beam of the observation device, the calibration image including a plurality of features of the predetermined reference structure;

identifying a first portion of the plurality of features of the calibration image that include:
- a feature size substantially similar to the known feature size of the predetermined reference structure; and
- a feature shape substantially similar to the known feature shape of the predetermined reference structure;

combining the identified first portion of the plurality of features of the calibration image to form a first stacked feature image; and determining a point spread function (PSF) of the charged particle beam by comparing the reference image of the predetermined reference structure with the stacked feature image;

restoring the captured calibration image of the predetermined reference structure using the determined PSF, the restored calibration image having a higher image resolution and clarity than the captured calibration image of the predetermined reference structure;

identifying a second portion of the plurality of features of the restored calibration image that include:
- a feature size substantially similar to the known feature size of the predetermined reference structure; and
- a feature shape substantially similar to the known feature shape of the predetermined reference structure;

combining the identified second portion of the plurality of features of the calibration image to form a second stacked feature image; and identifying changes to the operational performances of the observation device by comparing the reference image of the predetermined reference structure with the second stacked feature image.

* * * * *